United States Patent
Uemukai et al.

(10) Patent No.: US 7,451,515 B2
(45) Date of Patent: Nov. 18, 2008

(54) CLEANING PROCESSING SYSTEM AND CLEANING PROCESSING APPARATUS

(75) Inventors: Hidetomo Uemukai, Kumamoto-ken (JP); Akira Ishihara, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 818 days.

(21) Appl. No.: 10/932,265

(22) Filed: Sep. 2, 2004

(65) Prior Publication Data
US 2005/0022325 A1 Feb. 3, 2005

Related U.S. Application Data

(62) Division of application No. 09/966,082, filed on Oct. 1, 2001, now Pat. No. 6,842,932.

(30) Foreign Application Priority Data

| Oct. 2, 2000 | (JP) | ............................. 2000-302099 |
| Oct. 25, 2000 | (JP) | ............................. 2000-325640 |
| Oct. 25, 2000 | (JP) | ............................. 2000-325641 |

(51) Int. Cl.
*B08B 1/00* (2006.01)
*B08B 3/02* (2006.01)
*A46B 13/04* (2006.01)

(52) U.S. Cl. .............................. 15/77; 15/102; 15/88.2

(58) Field of Classification Search ..................... 15/77, 15/88.1, 88.2, 102, 21.1; 134/902, 144, 153, 134/95.3
See application file for complete search history.

(56) References Cited

U.S. PATENT DOCUMENTS

| 5,616,063 A | * | 4/1997 | Okumura et al. ................ 451/1 |
| 5,647,083 A | | 7/1997 | Sugimoto et al. ............... 15/77 |
| 5,826,129 A | * | 10/1998 | Hasebe et al. ................ 396/611 |
| 5,829,087 A | | 11/1998 | Nishiura et al. ............... 15/88.2 |
| 5,858,112 A | | 1/1999 | Yonemizu et al. .............. 134/6 |
| 6,059,891 A | | 5/2000 | Kubota et al. .................. 134/18 |
| 6,062,288 A | * | 5/2000 | Tateyama .................... 156/584 |
| 6,115,867 A | | 9/2000 | Nakashima et al. ............ 15/77 |
| 6,151,744 A | | 11/2000 | Ohtani et al. ................ 15/88.2 |
| 6,178,580 B1 | | 1/2001 | Ishihara et al. ................. 15/77 |
| 6,286,525 B1 | | 9/2001 | Nishimura et al. ......... 134/95.3 |

(Continued)

FOREIGN PATENT DOCUMENTS

JP         2000-49215        2/2000

(Continued)

*Primary Examiner*—David B Thomas
(74) *Attorney, Agent, or Firm*—Smith, Gambrell & Russell, LLP

(57) ABSTRACT

Disclosed herein is a processing system for applying a cleaning processing to a substrate such as a semiconductor wafer which includes a cleaning processing section including a plurality of process units each serving to apply a predetermined treatment to a wafer and a loading/unloading section 2 The cleaning processing section includes four scrub cleaning units consisting of two scrub cleaning units arranged side by side and two additional cleaning units stacked on the two scrub cleaning units arranged side by side, respectively, so as to form upper and lower stages of the scrub cleaning units, a wafer inversion unit for turning the wafer upside down, a wafer transit unit having the wafer disposed thereon temporarily for performing the transfer of the wafer to and from the transfer section, and a main wafer transfer mechanism.

19 Claims, 15 Drawing Sheets

U.S. PATENT DOCUMENTS

| | | | |
|---|---|---|---|
| 6,292,972 B1 | 9/2001 | Ishihara et al. | 15/77 |
| 6,385,805 B2 | 5/2002 | Konishi et al. | 15/77 |
| 6,651,285 B2 | 11/2003 | Yeo | 15/77 |
| 6,945,258 B2 * | 9/2005 | Itou | 134/56 R |

FOREIGN PATENT DOCUMENTS

| | | |
|---|---|---|
| JP | 2000-135475 A | 5/2000 |

* cited by examiner

CLEANING PROCESSING SYSTEM AND CLEANING PROCESSING APPARATUS

CROSS REFERENCE TO RELATED APPLICATION

This application is a division of application Ser. No. 09/966,082, filed Oct. 1, 2001, which is incorporated herein by reference in its entirety.

BACKGROUND OF THE INVENTION

1. Field of the Invention

The present invention relates to a cleaning processing system for performing a series of processing for applying a cleaning processing to a substrate such as a semiconductor wafer and to a cleaning processing apparatus for actually applying a cleaning processing to the substrate.

2. Description of the Related Art

In the manufacturing process of, for example, a semiconductor device, it is necessary to maintain a high cleanliness on the front and back surfaces of a semiconductor wafer, particularly, the surface of the wafer on which a semiconductor device is formed. For maintaining the required high cleanliness, the surface of the wafer is cleaned both before and after each of various manufacturing processes. Particularly, in the photolithography process, cleaning of the wafer surface is indispensable. For the cleaning of the wafer surface, it was customary to employ the scrub cleaning in which a rotating brush is reciprocated between the central portion and the peripheral portion of a rotating wafer while supplying a cleaning liquid onto the rotating wafer and while allowing the brush to abut against the wafer surface so as to remove the contaminant such as particles attached to the wafer surface.

The scrub cleaning is performed by using a cleaning processing system equipped with a plurality of process units including a plurality of scrub cleaning units for performing a series of processing. In the conventional cleaning processing system, a plurality of scrub cleaning units are generally arranged in a planar arrangement.

However, the diameter of the wafer has been increased in recent years. Where the scrub cleaning unit and other units arranged in the cleaning processing system such as a heating unit for applying, for example, a drying treatment to the wafer, an inverting unit for inverting the wafer so as to apply a scrub cleaning to the both surfaces of the wafer and the transfer mechanism of the wafer are enlarged in conformity with the enlargement of the wafer, the footprint of the cleaning processing system is markedly enlarged.

With enlargement of the footprint, it is rendered difficult to install the cleaning processing system in the existing clean room. Therefore, it is expected that the necessity may arise to expand the existing clean room or to newly install an additional clean room, leading to an increase in the facility cost. Such being the situation, it is of high importance to suppress as much as possible the increase in the footprint accompanying the enlargement of the wafer.

On the other hand, a problem remains unsolved in the conventional scrub cleaning unit that, for example, a mist of the cleaning liquid generated mainly around the brush is scattered so as to contaminate the cleaning process chamber. It is also possible for the scattered cleaning liquid to be attached to the mechanism for moving the brush, i.e., to the driving mechanism of the arm holding the brush, so as to bring about a defective operation. By contraries, it is also possible for the particles generated in, for example, the driving mechanism to be diffused within the cleaning apparatus, with the result that the diffused particles are attached to the wafer so as to degrade the wafer.

An additional problem to be noted is that, in the prior art, a single brush is mounted to a single scrub cleaning unit. In the cleaning processing using a single brush, the processing time per wafer is increased with increase in the diameter of the wafer so as to lower the through-put. It should also be noted that the miniaturization and the progress in the degree of the high density integration of the device formed on the substrate to be processed are being promoted simultaneously with the enlargement of the wafer. In this connection, the substrate is required to be subjected to a cleaning processing of a higher cleanliness. Where the cleaning processing with an improved cleanliness is applied to the wafer having a large diameter, a long time is required for the cleaning processing of a single substrate. It follows that it is required to develop a cleaning processing apparatus capable of performing a uniform cleaning processing in a short time over the entire substrate to be processed.

BRIEF SUMMARY OF THE INVENTION

An object of the present invention is to provide a cleaning processing system capable of suppressing the increase in a footprint in accordance with the enlargement of the substrate.

Another object of the present invention is to provide a cleaning processing apparatus capable of preventing the occurrence of a defective operation caused by the attachment of the scattered cleaning liquid to the various driving systems and also capable of preventing the particles generated from the driving systems from being scattered toward the substrate.

Another object of the present invention is to provide a cleaning processing apparatus capable of shortening the cleaning processing time per single substrate to be processed.

Another object of the present invention is to provide a cleaning processing apparatus capable of preventing the scattering of the cleaning liquid so as to keep clean the inner region of the cleaning processing apparatus.

Another object of the present invention is to provide a cleaning processing apparatus capable of performing the cleaning processing effectively and uniformly.

Another object of the present invention is to provide a cleaning processing apparatus capable of shortening the cleaning processing time of a large substrate to be processed so as to improve the through-put.

Further, still another object of the present invention is to provide a cleaning processing apparatus capable of selecting various cleaning modes so as to carry out the optimum cleaning processing and, thus, to improve the quality of cleaned substrate.

According to a first aspect of the present invention, there is provide a cleaning processing system for applying a series of processing for the cleaning processing to a substrate, comprising a plurality of scrub cleaning units stacked one upon the other to form a multi-stage system; and a substrate transfer mechanism capable of gaining access to all of said plural scrub cleaning units.

According to a second aspect of the present invention, there is provide a cleaning processing system for applying a series of processing for the cleaning processing to a substrate, comprising a cleaning processing section including a plurality of process units for applying predetermined processing to the substrate; and a substrate loading/unloading section for loading and unloading the substrate into and out of said cleaning processing section; wherein said cleaning processing section includes a plurality of scrub cleaning units arranged to form at least upper and lower stages, a substrate inverting unit for turning the substrate upside down, a substrate transit unit for temporarily disposing the substrate thereon for the transfer of the substrate to and from said substrate loading/unloading section, and a substrate transfer mechanism capable of gaining access to all of the process units including said scrub cleaning unit, said substrate inverting unit, and said substrate transit unit thereby to perform transfer of the substrate among said process units.

According to a third aspect of the present invention, there is provide a cleaning processing apparatus for applying a cleaning processing to a substrate, comprising a spin chuck for holding a substrate substantially horizontal for planar rotation of the substrate; a cup arranged to surround said spin chuck; a brush for cleaning the upper surface of the substrate held by said spin chuck; a brush holding arm for holding said brush; an arm driving mechanism for driving said brush holding arm; and a partition wall arranged to separate the arranging section of said cup from the arranging section of said arm driving mechanism.

According to a fourth aspect of the present invention, there is provide a cleaning processing apparatus for applying a cleaning processing to a substrate, comprising a spin chuck for holding a substrate substantially horizontal for planar rotation of the substrate; a cup arranged to surround said spin chuck; a brush arranged to abut against the upper surface of the substrate held by said spin chuck for performing a scrub cleaning; a brush holding arm for holding said brush; an arm driving mechanism for driving said brush holding arm; a cleaning liquid supply mechanism for supplying a cleaning liquid to the substrate held by said spin chuck; and a brush cover arranged outside said brush and on the side of said arm driving mechanism for suppressing the scattering of a cleaning liquid toward said arm driving mechanism during the cleaning processing.

According to a fifth aspect of the present invention, there is provide a cleaning processing apparatus for applying a cleaning processing to a substrate, comprising a spin chuck for holding a substrate substantially horizontal for planar rotation of the substrate; a brush arranged to abut against the upper surface of the substrate held by said spin chuck for performing a scrub cleaning; a brush holding arm for holding said brush; an arm driving mechanism for driving said brush holding arm; and first and second process liquid spurting nozzles for spurting a process liquid to the substrate held by said spin chuck; wherein the process liquid is spurted from said first process liquid spurting nozzle to substantially the center of the substrate held by said spin chuck, and the process liquid is spurted from said second process liquid spurting nozzle to a predetermined position outside the center of the substrate held by said spin chuck.

Further, according to a sixth aspect of the present invention, there is provide a cleaning processing apparatus for applying a cleaning processing to a substrate, comprising a spin chuck for holding a substrate substantially horizontal for planar rotation of the substrate; a plurality of brushes for cleaning the upper surface of the substrate held by said spin chuck; a plurality of brush holding arms for holding said brushes, respectively; a plurality of arm driving mechanisms for scanning independently said plural brush holding arms; and a controller for controlling said plural arm driving mechanisms; wherein at least one of said plural brush holding arms: is capable of outrunning the other brush holding arms in the scanning direction.

In the cleaning processing system according to each of the first and second aspects of the present invention, a plurality of scrub cleaning units are stacked one upon the other to form a multi-stage system, though the scrub cleaning units were arranged planar in the prior art. As a result, even if the scrub cleaning unit is enlarged in accordance with enlargement of the substrate, it is possible to suppress the increase of the footprint to a minimum level. Also, since the scrub cleaning units are stacked one upon the other to form a multi-stage system, it is possible to achieve the shortening of the through-put by increasing the number of scrub cleaning units mounted to the cleaning processing system. The through-put can also be shortened by arranging a plurality of units for performing the other processing such as a plurality of transit units, a plurality of inversion units, and a plurality of heating/cooling units in addition to the plural scrub cleaning units. Further, it is possible to suppress, for example, the attachment of particles to the substrate by using properly these plural units in accordance with the process step so as to maintain a high quality of the substrate.

In the cleaning processing apparatus according to the third embodiment of the present invention, the arranging section of the cup in which the cleaning processing is performed separated by a partition wall from the arranging section of the arm driving mechanism. As a result, the cleaning liquid scattered from within the cup is prevented from being attached to the arm driving mechanism so as to prevent a defective operation of the arm driving mechanism. By contraries, it is possible to prevent the problem that the particles generated from the arm driving mechanism are diffused into the arranging section of the cup so as to be attached to the substrate. It follows that the quality of the substrate is prevented from being lowered.

In the cleaning processing apparatus according to the fourth aspect of the present invention, a brush cover is arranged in a predetermined position outside the brush in a manner to surround a part of the outer circumferential region of the brush. As a result, even where the cleaning liquid supplied to the substrate is scattered during the cleaning processing, the brush cover serves to prevent the cleaning liquid from being scattered toward the side of the proximal end of the brush holding arm. It follows that it is possible to solve the problem in respect of the attachment of the cleaning liquid to the arm driving mechanism and the defective operation of the arm driving mechanism caused by the attachment of the cleaning liquid.

In the cleaning processing apparatus according to the fifth aspect of the present invention, the spurting position of the cleaning liquid is made optimum. As a result, a uniform liquid film is formed on the upper surface of the substrate even if the amount of the cleaning liquid used is small. It follows that the running cost of the cleaning processing can be suppressed. In addition, the cleaning processing can be performed uniformly over the entire region of the substrate so as to improve the quality of the cleaned substrate.

In the cleaning processing apparatus according to the sixth aspect of the present invention, at least one holding arm of the brush is capable of outrunning the other holding arms of the brushes. As a result, the holding arms of the brushes can be driven in various fashions. It follows that it is possible to perform the cleaning processing in conformity with the kind of the substrate to be processed and with the required cleanliness.

DETAILED DESCRIPTION OF THE INVENTION

The cleaning processing system according to one embodiment of the present invention will now be described in detail with reference to the accompanying drawings. This embodiment is directed to a cleaning processing system constructed such that the putting-in, cleaning, drying and putting-out of a semiconductor wafer (hereinafter referred to simply as "wafer"), which is a substrate to be processed, can be performed on the single wafer type system.

Figure 1:
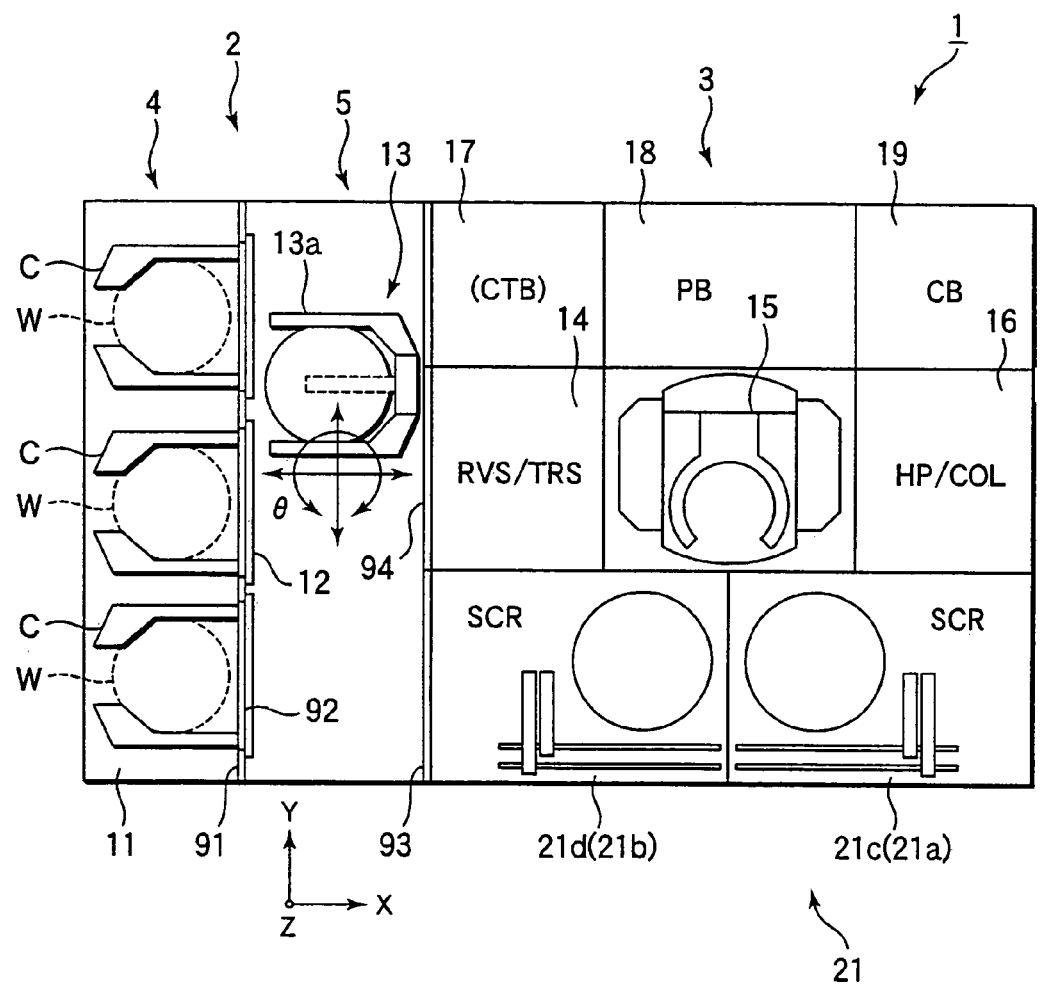
FIG. 1 is a plan view schematically showing the construction of a cleaning processing system according to one embodiment of the present invention.
Figure 2:
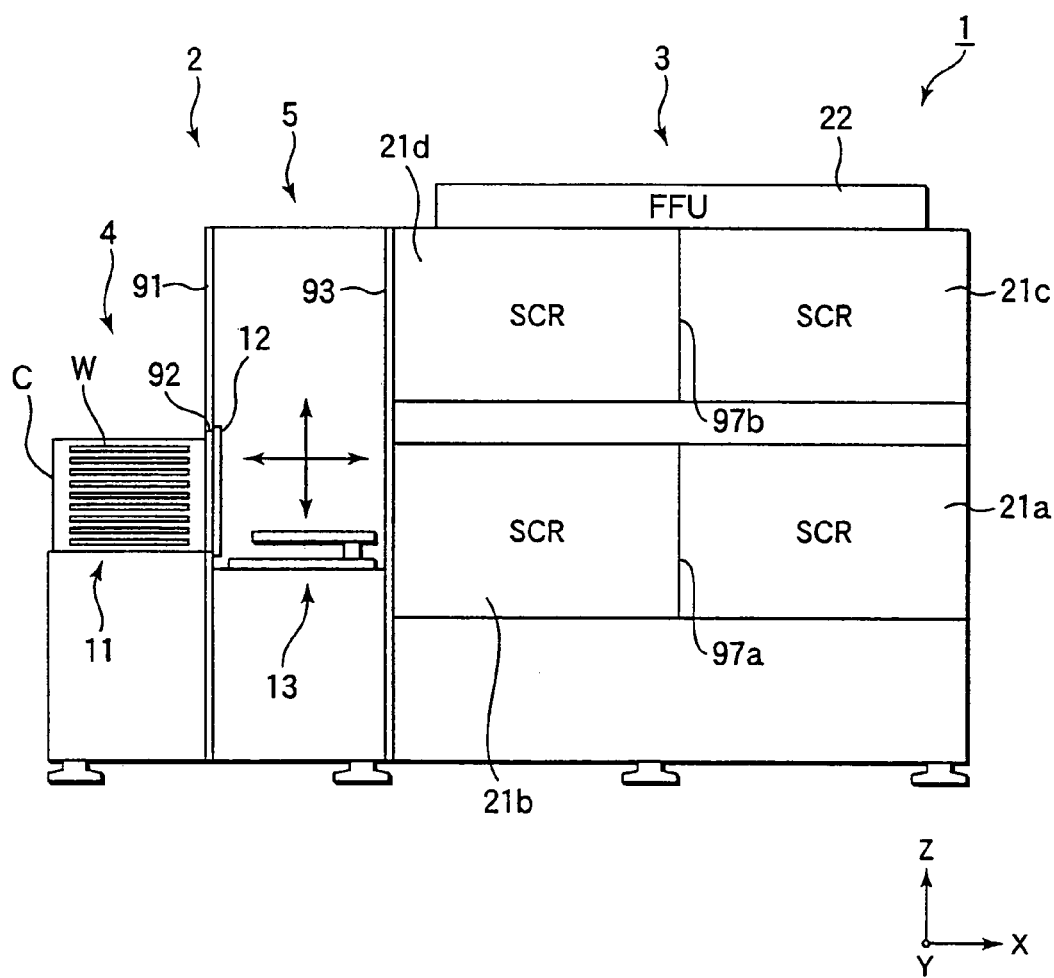
FIG. 2 is a side view of the cleaning processing system shown in FIG. 1.
Figure 3:
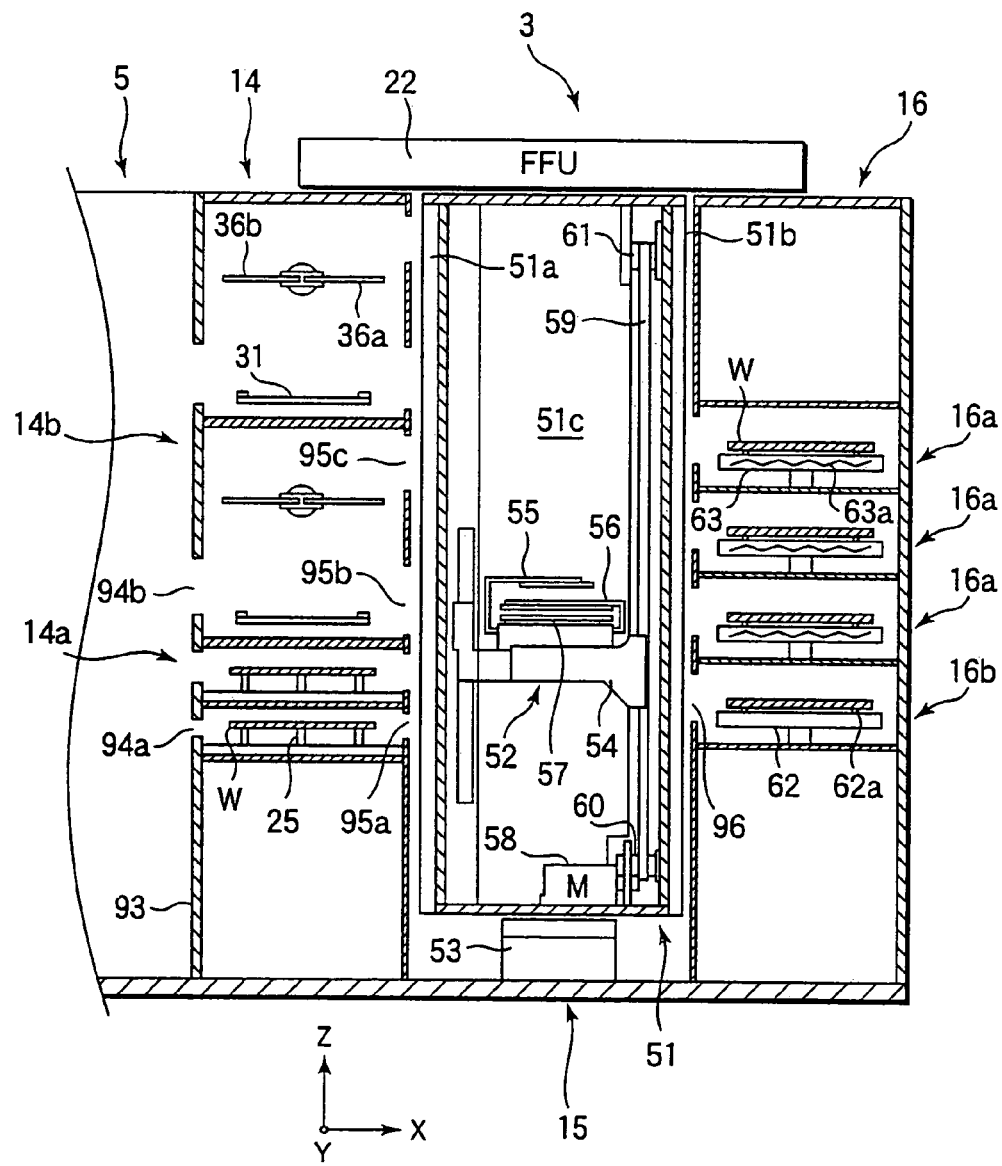
FIG. 3 is a cross sectional view of the cleaning processing system shown in FIG. 1.

FIG. 1 is a plan view schematically showing the construction of a cleaning processing system 1 according to the embodiment of the present invention, FIG. 2 is a side view of the cleaning processing system 1 shown in FIG. 1, and FIG. 3 is a cross sectional view of the cleaning processing system 1 shown in FIG. 1. As shown in FIGS. 1 and 2, the cleaning processing system 1 comprises a cleaning processing section 3 for applying a cleaning processing to a wafer W, and a loading/unloading section 2 for loading and unloading the wafer W into and out of the cleaning processing section 3.

In the cleaning processing system 1, the loading/unloading section 2 consists of an in-out port 4 in which is arranged a table 11 having carriers C disposed thereon and a wafer transfer section 5 equipped with a wafer transfer mechanism 13 for transferring the wafer W between the carrier C and the cleaning processing section 3. A plurality of wafers, e.g., 26 wafers, are horizontally arranged in the carrier C a predetermined distance apart from each other.

It is possible to dispose, for example, three carriers C in predetermined positions on the table 11 arranged in the in-out port 4 such that these carriers C are arranged in the Y-direction on the horizontal plane. Also, a window portion 92 is formed in a boundary wall 91 between the in-out port 4 and the wafer transfer section 5. The window portion 92 is formed in the position corresponding to the position where the carrier C is disposed. Further, a window portion opening-closing mechanism 12 for opening-closing the window portion 92 by, for example, a shutter is arranged on the side of the wafer transfer section 5 of the window portion 92.

The construction of the carrier C used is not particularly limited. For example, it is possible to use a carrier equipped with a lid for opening-closing the transfer outlet port of the carrier for transferring the wafer W out of the carrier. In this case, it is possible to allow the window portion opening-closing mechanism 12 to perform the function of opening-closing the lid of the carrier C such that, when the carrier C is disposed on the table 11 in a manner to allow the transfer outlet port of the carrier C to face the window portion 92, the window portion opening-closing mechanism 12 serves to open-close the window portion 92 and the lid of the carrier C. If the window portion 92 and the lid of the carrier C are opened by the window portion opening-closing mechanism 12 of the particular construction, it is possible for the wafer transfer mechanism 13 arranged in the wafer transfer section 5 to gain access to the carrier C so as to transfer the wafer W.

Incidentally, it is possible to arrange in the window portion 92 a shutter alone for opening-closing the window portion 92 such that, when the lid mounted to the transfer outlet port of the carrier C is disposed on the table 11, the lid is manually operated so as to open the transfer outlet port. Also, where a lid is not mounted to the carrier C, the opening-closing mechanism of the lid need not be arranged, quite naturally. In this fashion, it is possible to design appropriately the construction of the window portion 92 in accordance with the construction of the carrier C.

It is also possible to arrange a sensor in the window portion closing-opening mechanism 12 so as to detect the housed state of the wafers W in the carrier C, e.g., so as to detect whether or not a predetermined number of wafers W are housed in the carrier C, whether or not the wafer W is housed in the carrier C in a protruding state in the front-rear direction (X-direction), and whether or not the wafer W is housed obliquely in the height direction in the carrier C. In the case of arranging the particular sensor, it is possible to start the cleaning processing after the housed state of the wafer W in the carrier C is inspected.

The wafer transfer mechanism 13 for performing the transfer of the wafer W between the carrier C and the cleaning processing section 3 is arranged in the wafer transfer section 5. The wafer transfer mechanism 13 is movable in the Y-direction so as to gain access to all the carriers C disposed on the table 11. Also, the wafer transfer mechanism 13 includes a wafer holding arm 13a, which is slidable in the X-direction on the horizontal plane and rotatable within the X-Y plane (θ-direction). The wafer holding arm 13a is capable of transferring the wafer W to and from the carrier C through the window portion 92, and also capable of gaining access to a wafer transit unit (TRS) 14a arranged in the cleaning processing section 3 described herein later. It follows that it is possible for the wafer transfer mechanism 13 to transfer the wafer W from the in-out port 4 toward the cleaning processing section 3 and, by contraries, from the cleaning processing section 3 toward the in-out port 4. Further, the wafer transfer mechanism 13 is movable in the vertical direction, i.e., in the Z-direction, so as to make it possible to perform the transfer of the wafer W at an optional height within the carrier C.

The cleaning processing section 3 will now be described.

The cleaning processing section 3 comprises a transfer/inversion section 14 formed by stacking two wafer transit units (TSR) 14a each having the wafer W disposed thereon temporarily in order to carry out the transfer of the wafer W to and from the wafer transfer section 5 on two wafer inversion units (RVS) 14b for inverting the wafer W upside down, a heating/cooling section (HP/COL) 16 consisting of a plurality of units, which are stacked one upon the other, for applying a heat treatment to the wafer W after the cleaning processing for the drying purpose or for applying a cooling treatment to the wafer after the heat treatment for the drying, a scrub cleaning section 21 consisting of four scrub cleaning units (SCR) 21a to 21d for applying a scrub cleaning to the wafer W, the scrub cleaning units 21a and 21c being stacked one upon the other and the other scrub cleaning units 21b and 21d being stacked one upon the other and these two stacked structures being arranged side by side, and a main wafer transfer mechanism 15 capable of gaining access to each of all the units included in the wafer inversion unit (RVS) 14b, the wafer transit unit (TRS) 14a, the scrub cleaning units (SCR) 21a to 21d, and the heating/cooling section (HP/COL) 16 so as to carry out the transfer of the wafer W to and from each of these sections and units.

An power supply box (PB) 18 and a control box (CB) 19 for operating and controlling the entire cleaning processing system 1 are arranged in the cleaning processing section 3. Also arranged in the cleaning processing section 3 is a chemical tank box (CTB) 17 for storing a predetermined cleaning liquid that is to be supplied to the scrub cleaning units (SCR) 21a to 21d. Further, a filter fan unit (FFU) 22 for supplying a clean air in a down flow fashion into each unit handling the wafer W and into the main wafer transfer mechanism 15 is arranged in the ceiling portion of the cleaning processing section 3. Incidentally, it is possible for the chemical tank box (CTB) 17 to be arranged below the scrub cleaning units 21a to 21d.

As shown in FIG. 3, the main wafer transfer mechanism 15 comprises a cylindrical support member 51 including vertical walls 51a, 51b extending in the Z-direction and a side surface open portion 51c positioned between the vertical walls 51a and 51b, and a wafer transfer member 52 arranged movable in the vertical Z-direction within the inner space of the cylindrical support member 51. The cylindrical support member 51 can be rotated by the rotary driving force generated by a motor 53. In accordance with rotation of the cylindrical support member 51, the wafer support member 52 is also rotated integrally.

The wafer transfer member 52 includes a transfer base 54, and three main wafer transfer arms 55, 56 and 57 movable back and forth along the transfer base 54. Each of main wafer transfer arms 55 to 57 is sized to be capable of passing through the side open portion 51c of the cylindrical support member 51. Also, each of these main wafer transfer arms 55 to 57 can be moved back and forth independently by the motor and the belt mechanism housed in the transfer base 54. The wafer transfer member 52 can be moved up and down by allowing a motor 58 to drive a belt 59. Incidentally, a reference numeral 60 shown in FIG. 3 denotes a driving pulley, and a reference numeral 61 denotes a driven pulley.

As shown in FIG. 3, the transfer/inversion section 14 comprises the wafer transit units (TRS) 14a, which are stacked one upon the other to form two stages and arranged in the lower side, and the wafer inversion units (RVS) 14b, which are also stacked one upon the other to form two stages and arranged on the wafer transit unit (TRS) 14a on the upper stage.

An open portion 95a into which the main wafer transfer arms 55 to 57 of the main wafer transfer mechanism 15 can be inserted is formed in the side wall of the wafer transit unit (TRS) 14a on the side of the main wafer transfer mechanism 15. Also, a wall portion 93 is formed between the cleaning processing section 3 and the wafer transfer section 5. It should be noted that a window portion 94a is formed in that region of the wall portion 93 which is positioned between the wafer transit unit (TRS) 14a and the wafer transfer section 5. The wafer W can be transferred between the wafer transfer mechanism 13 and the wafer transit unit (TRS) 14a through the window portion 94a.

Figure 4:
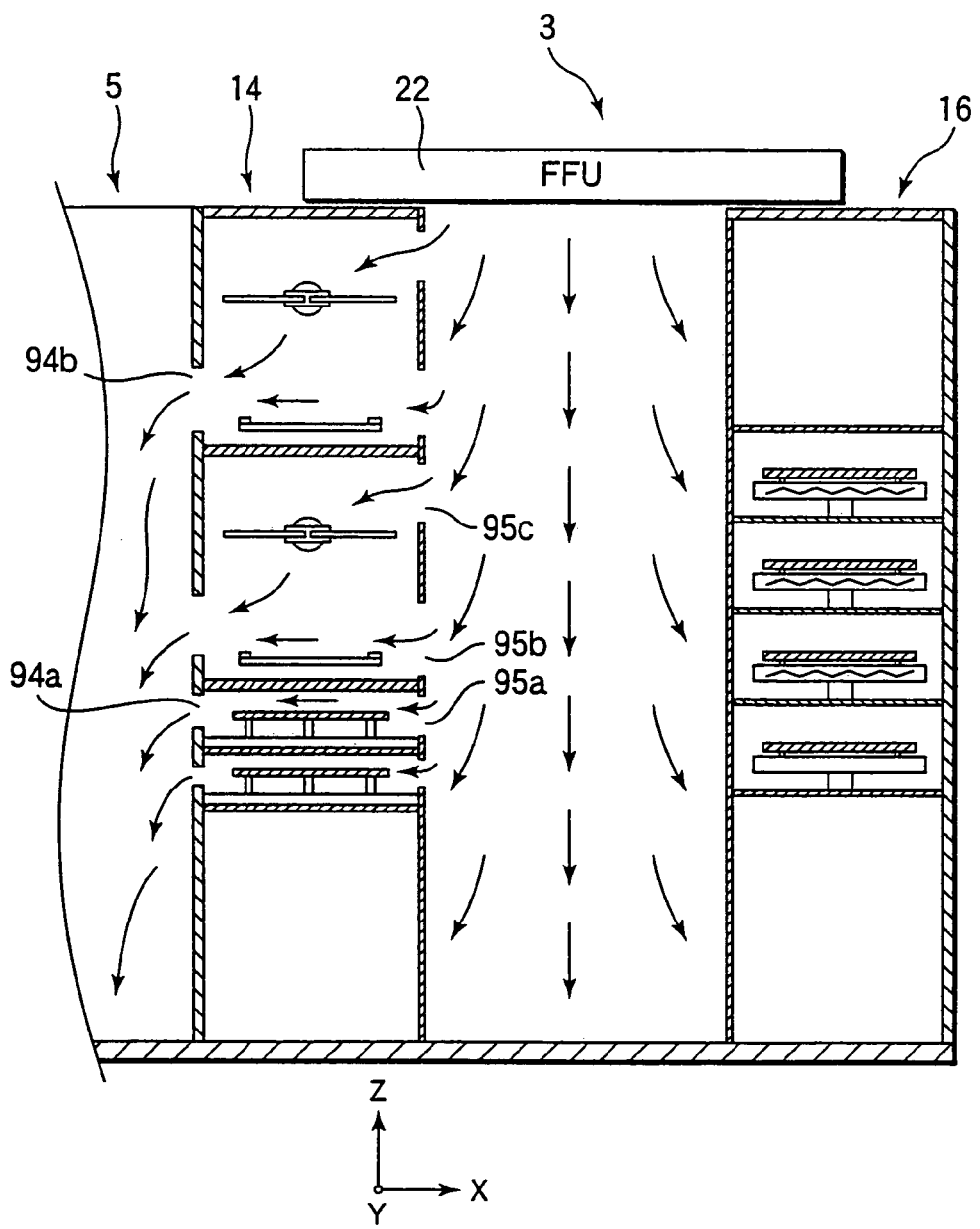
FIG. 4 shows the state of down flow from a filter, fan unit (FFU) performed in the cleaning processing system shown in FIG. 1.

FIG. 4 is a cross sectional view equal to that shown in FIG. 3 and shows how a clean air is supplied in the down flow fashion from the filter fan unit (FFU) 22. In FIG. 4, the region where the main wafer transfer mechanism 15 is arranged is shown vacant in order to clearly set forth the down flow fashion of the clean air. As shown in FIG. 4, a part of the clean air flowing downward from the filter fan unit (FFU) 22 is guided from the open portion 95a into the wafer transit unit (TRS) 14a and flows out of the wafer transit unit (TRS) 14a into the wafer transfer section 5 through the window portion 94a.

Because of the particular construction described above, particles, etc. generated from the wafer transfer section 5 are prevented from flowing into the cleaning processing section 3, thereby maintaining a desired cleanliness within the cleaning processing section 3. Also, the clean air guided into the wafer transfer section 5 serves to prevent the particles, etc. from flowing from the in-out port 4 into the wafer transfer section 5, thereby maintaining a desired cleanliness within the wafer transfer section 5. It follows that the entire cleaning processing system 1 is constructed to prevent the particles, etc. from being attached to the wafer W.

It is possible for the window portion 94a and the open portion 95a to be formed openable by a shutter or the like. In this case, it is desirable for the window portion 94a and the open portion 95a to be kept open during operation of the filter fan unit (FFU) 22 whether the wafer transit unit (TRS) 14a is being used or not. Also, it is possible for the window portion 94a and the open portion 95a to be kept open regardless of the operating state of the filter fan unit (FFU) 22.

A plurality of pins 25 projecting upward are mounted to predetermined positions on the bottom surface of the wafer transit unit (TRS) 14a. For example, the wafer holding arm 13a of the wafer transfer mechanism 13 holding the wafer W is inserted into a region above the pins 25, followed by moving downward the wafer holding arm 13a such that the wafer W is released from the wafer holding arm 13a so as to be disposed on the pins 25. Incidentally, in the case of employing the method of disposing the wafer W on the pins 25, a single wafer W is held by a single unit in principle. However, it is possible to dispose a plurality of wafers W on a single unit, if the apparatus is constructed to permit the wafers W to be held by guides arranged to form multiple stages like the carrier C constructed to house a plurality of wafers W.

It is possible to use in various fashions the wafer transit units (TRS) 14a arranged to form upper and lower stages. For example, it is possible to dispose only the wafers W before the cleaning processing, which are transferred from the wafer transfer section 5 into the cleaning processing section 3, on the lower stage wafer transit unit (TRS) 14a, and to dispose only the wafers after the cleaning processing, which are transferred from the cleaning processing section 3 into the wafer transfer section 5, on the upper stage wafer transit unit (TRS) 14*a*. In this case, the particles or the like coming from the unprocessed wafers W and attached to the pins 25 are prevented from being attached again to the wafers W after the cleaning processing so as to suppress the contamination of the wafers W and, thus, to keep clean the wafers W.

It is also to use the wafer transit units (TRS) 14*a* quite at random in accordance with progress of the cleaning processing such that the unprocessed wafers W that are to be transferred into the cleaning processing section 3 are disposed on both the upper and lower stage wafer transit units (TRS) 14*a* in a certain time and the processed wafers W alone, which are to be transferred into the wafer transfer section 5, are disposed on both the upper and lower stage wafer transit units (TRS) 14*a* in another time. In this case, the through-put can be increased so as to improve the productivity.

The wafer inversion unit (RVS) 14*b* arranged in the transfer/inversion section 14 will now be described. As shown in FIG. 3, an open portion 95*b* into which the main wafer transfer arms 55 to 57 of the main wafer transfer mechanism 15 can be inserted is formed in a lower portion of the side wall of the wafer inversion unit (RVS) 14*b* on the side of the main wafer transfer mechanism 15. Also, a window portion 95*c*, through which the clean air flowing downward from the filter fan unit (FFU) 22 is introduced into the wafer inversion unit (RVS) 14*b*, is formed in an upper portion of the side wall of the wafer inversion unit (RVS) 14*b* on the side of the main wafer transfer mechanism 15. It should be noted that the entire side surface of the wafer inversion section (RVS) 14*b* on the side of the main wafer transfer mechanism 15 may be left open. Also, the wall portion 93 is formed between the cleaning processing section 3 and the wafer transfer section 5, and a window portion 94*b* is formed in that region of the wall portion 93 which corresponds to the boundary between the wafer inversion unit (RVS) 14*b* and the wafer transfer section 5.

Because of the particular construction described above, a part of the clean air flowing downward from the filter fan unit (FFU) 22 is introduced into the wafer inversion unit (RVS) 14*b* through the open portions 95*b*, 95*c* and flows out of the wafer inversion unit (RVS) 14*b* toward the wafer transfer section 5 through the window portion 94*b* as shown in FIG. 4, as is the case with the wafer transit unit (TRS) 14*a* described previously. It follows that the particles, etc. are prevented from flowing from the wafer transfer section 5 into the cleaning processing section 3 so as to keep clean the cleaning processing section 3. It is also possible to keep clean the wafer transfer section 5.

Figure 5:
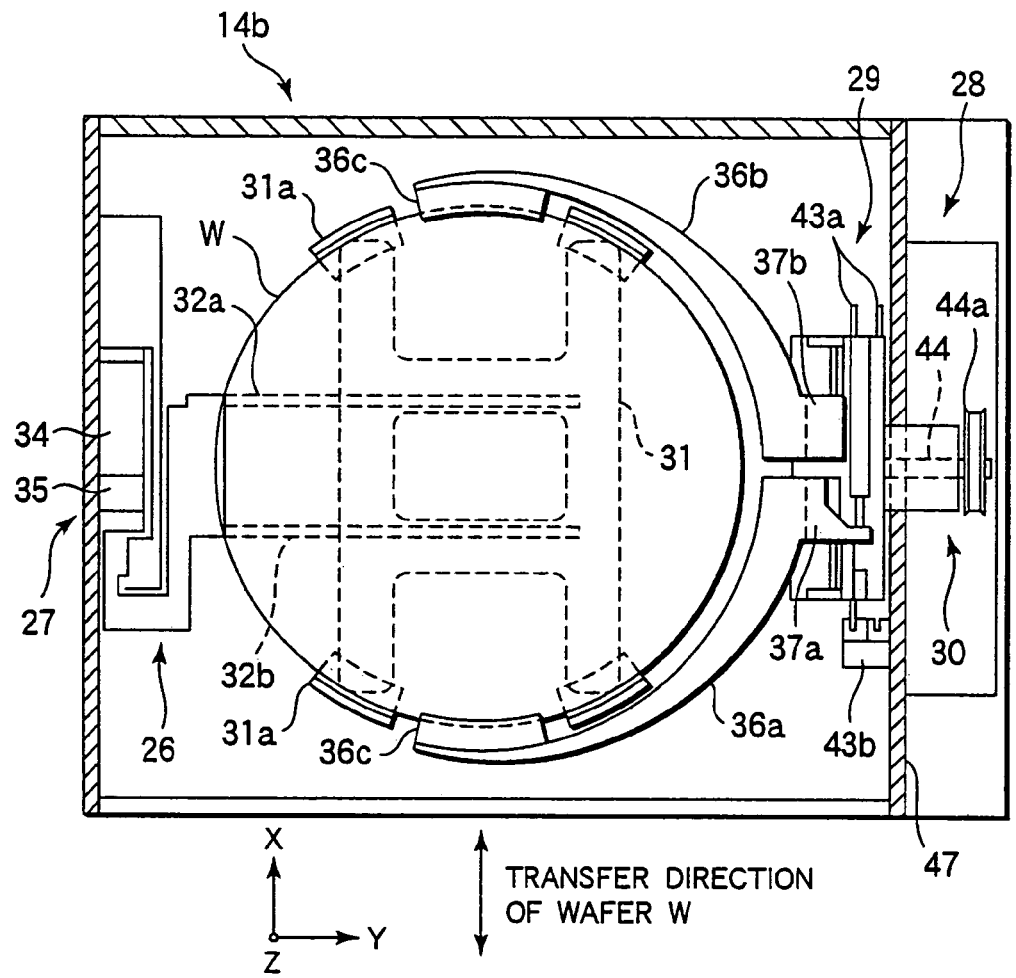
FIG. 5 is a plan view schematically showing the construction of a wafer inverting unit (RVS) mounted to the cleaning processing system shown in FIGS. 1 to 3.
Figure 6:
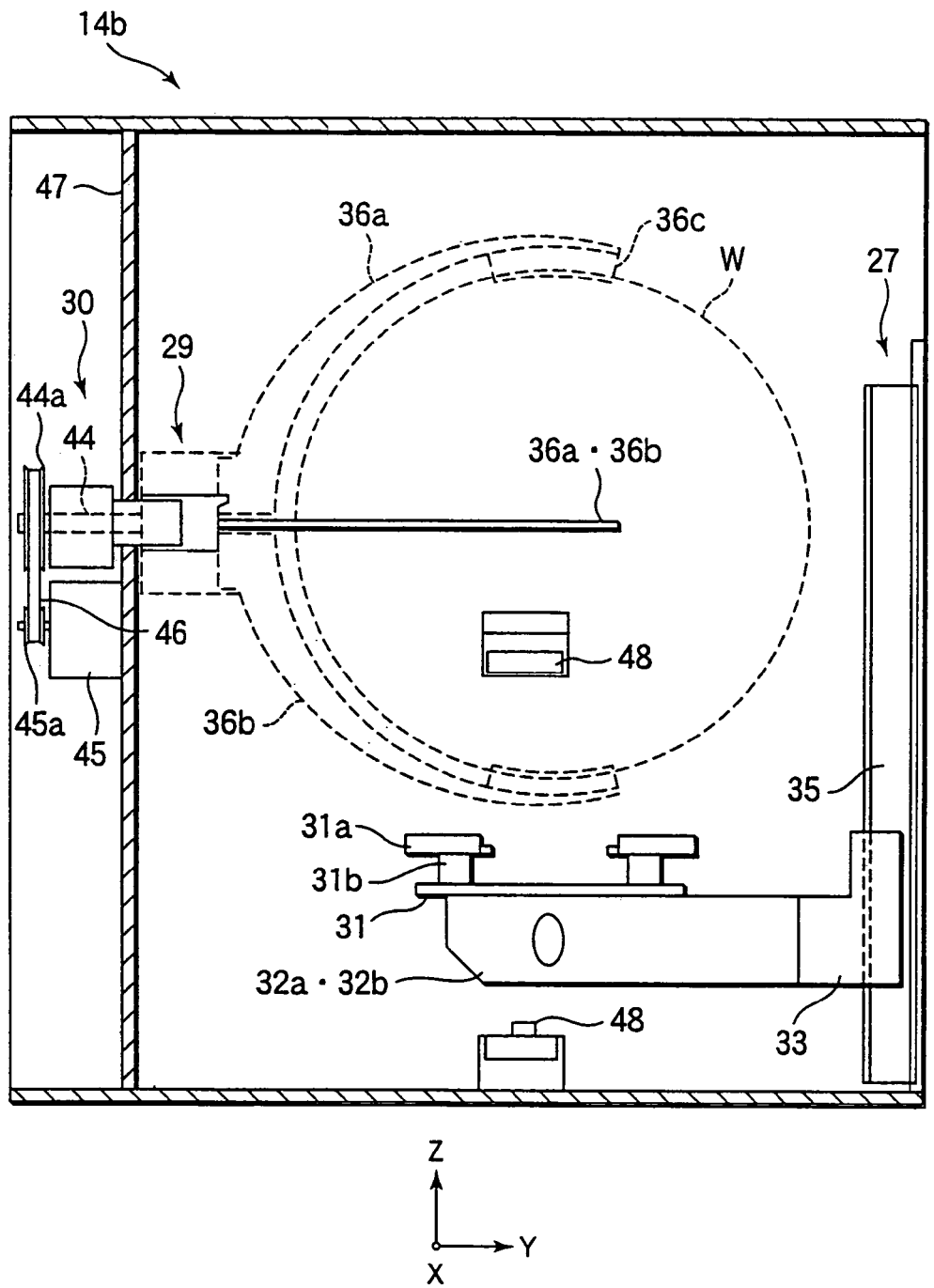
FIG. 6 is a side view schematically showing the construction of the wafer inverting unit (RVS) shown in FIG. 5.

FIG. 5 is a plan view schematically showing the construction of the wafer inversion unit (RVS) 14*b*, and FIG. 6 is a side view schematically showing the construction of the wafer inversion unit (RVS) 14*b*. As shown in the drawings, the wafer inversion unit (RVS) 14*b* includes a wafer relay section 26 performing the transfer of the wafer W to and from the main wafer transfer mechanism 15, a lift mechanism 27 for vertically moving the wafer relay section 26, and a wafer inversion mechanism 28 for holding and receiving the wafer W held by the wafer relay section 26, for inverting the held wafer W by rotation, and for transferring again the wafer W to the wafer relay section 26.

As shown in FIGS. 5 and 6, the wafer relay section 26 includes a substantially H-shaped support base 31 and two support arms 32*a*, 32*b* holding the support base 31 horizontally. Leg portions 31*b* are arranged at four edge portions of the support base 31, and a holding member 31*a* formed to have a substantially L-shaped cross section is arranged on each of the leg portions 31*b*. The peripheral portion of the wafer W is in contact with the bottom portion of the holding member 31*a*, and the vertical wall of the holding member 31*a* is positioned outside so as to act as a guide when the wafer W is held by the holding member 31*a*. In this fashion, the wafer W can be held by the holding member 31*a*.

The proximal end portions of the support arms 32*a*, 32*b* are fixed to a block 33 mounted to the lift mechanism 27. The block 33 is joined to an air cylinder 34 shrinkable in the Z-direction and is guided by a guide member 35 arranged to extend in the Z-direction in accordance with the vertical movement of the air cylinder 34. It follows that the block 33 can be moved up and down. Incidentally, the lift mechanism 27 is not limited to the construction using the particular air cylinder 34. It is also possible to employ the construction that the rotary driving force of a rotary driving mechanism such as a motor is transmitted to the block 33 by using a pulley, a belt, etc. so as to move the block 33 up and down.

The wafer inversion mechanism 28 includes a set of wafer holding arms 36*a*, 36*b* arranged openable in the X-direction, and a holding member 36*c* having a V-shaped groove formed in the bottom portion in a manner to extend along the side surface of the wafer W is formed in the distal end portion of each of the wafer holding arms 36*a* and 36*b*. When the wafer holding arms 36*a*, 36*b* are closed, the peripheral portion of the wafer W is held by the V-shaped groove such that the wafer W is held by the wafer holding arms 36*a*, 36*b* in the peripheral regions opposite to each other in the direction of the diameter of the wafer W. Incidentally, the broken lines shown in FIG. 6 denote the state that the wafer holding arms 36*a*, 36*b* holding the wafer W in the horizontal direction are swung by 90° so as to allow the wafer holding arms 36*a*, 36*b* to hold the wafer W vertical.

Figure 7A:
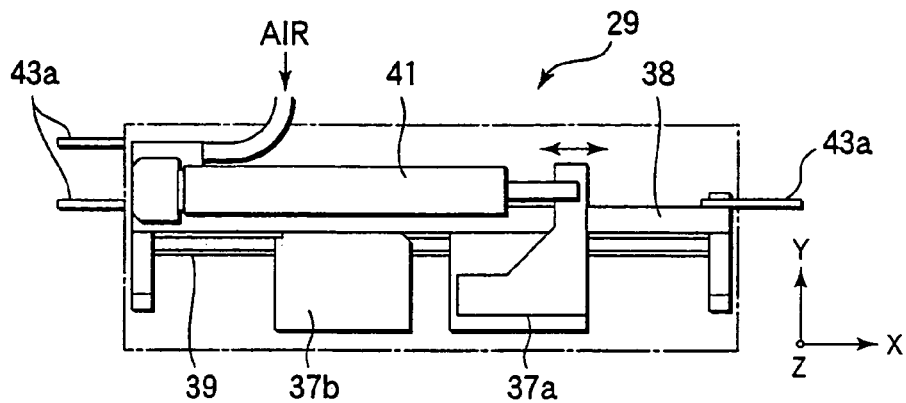
FIG. 7A is a plan view showing the opening-closing mechanism in the X-direction of the wafer holding arm included in the wafer inverting unit (RVS) shown in FIG. 5.
Figure 7B:
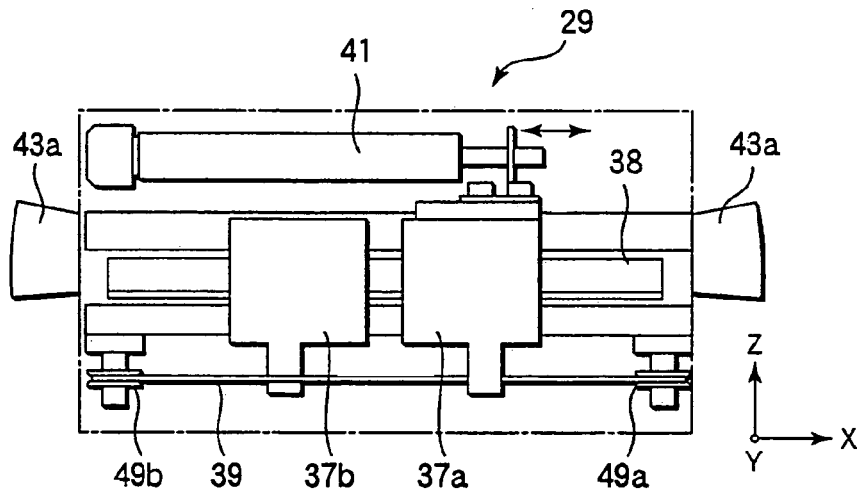
FIG. 7B is a side view showing the opening-closing mechanism in the X-direction of the wafer holding arm.
Figure 7C:
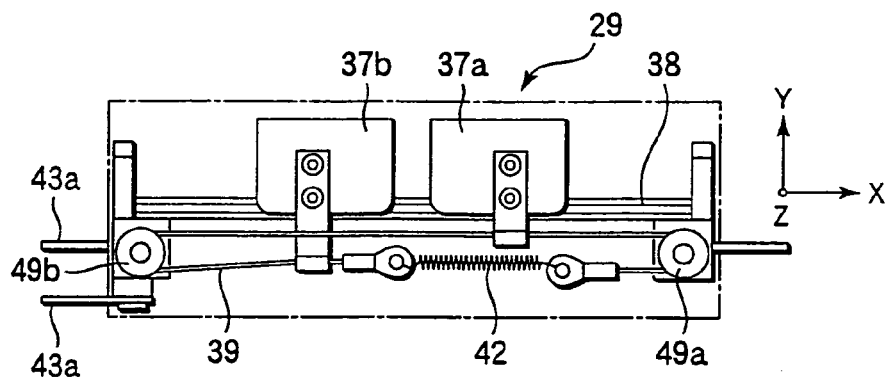
FIG. 7C is a bottom view showing the opening-closing mechanism in the X-direction of the wafer holding arm.

FIGS. 7A to 7C collective show an opening-closing mechanism 29 for opening-closing the wafer holding arms 36*a*, 36 in the X-direction, wherein FIG. 7A is a plan view, FIG. 7B is a side view, and FIG. 7C is a bottom view.

The proximal end portions of the wafer holding arms 36*a*, 36*b* are fixed to Z-X edge planes of guide blocks 37*a*, 37*b*, and the guide blocks 37*a*, 37*b* are engaged with a guide 38 extending in the X-direction so as to be slidable in the X-direction. The guide block 37*a* is fixed to the upper side in the Y-direction (FIG. 7C) of a wire 39 stretched between pulleys 49*a*, 49*b* arranged in parallel in the X-direction. On the other hand, the guide block 37*b* is connected to the lower side in the Y-direction (FIG. 7C) of the wire 39. Further, the guide block 37*a* is fixed to the distal end of an air cylinder 41 shrinkable in the X-direction. Incidentally, a spring 42 joining the wires 39 performs the function of maintaining constant the tension of the wire 39.

Where the air cylinder 41 is elongated to the right in the X-direction in the opening-closing mechanism 29 of the construction shown in FIGS. 7A to 7C, the guide block 37*a* is also moved to the right in the X-direction. In this case, the guide block 37*a* rotates the wire 39 so as to allow that portion of the wire 39 which is positioned on the upper side in the Y-direction to be moved to the right in the X-direction. As a result, that portion of the wire 39 which is positioned on the lower side in the Y-direction is moved to the left in the X-direction. In accordance with the particular movement of the wire 39, the guide block 37*b* mounted to that portion of the wire 39-which is positioned on the lower side in the Y-direction is moved to the left in the X-direction. It follows that the distance between the guide blocks 37*a* and 37*b* is increased in accordance with elongation of the air cylinder 41 so as to open the wafer holding arms 36*a*, 36*b*. By contraries, when the air cylinder 41 is shrunk, the wafer holding arms 36*a*, 36*b* are closed.

A rotary driving mechanism 30 permits the wafer holding arms 36a, 36b and the opening-closing mechanism 29 in the X-direction to be swung by 180° around a rotary shaft 44 parallel to the Y-direction. As a result, the upper and lower surfaces of the wafer W are inverted. As shown in FIGS. 5 and 7, a projecting portion 43a mounted to the edge in the X-direction of the X-direction opening-closing mechanism 29 serves to control the positions of the wafer holding arms 36a, 36b and the X-direction opening-closing mechanism 29 so as to permit the wafer W to be held horizontal when the X-direction opening-closing mechanism 29 is inverted. As shown in, for example, FIG. 5, the projecting portion 43a abuts against a projection holding portion 43b formed as a separate body so as to determine the horizontal direction.

The rotary driving mechanism 30 is constructed to include, for example, a rotary shaft 44 extending in parallel in the Y-direction and having one end mounted to the X-direction opening-closing mechanism 29, a pulley 44a fixed to the rotary shaft 44, a rotating motor 45, and a pulley 45a fixed to the rotary shaft of the rotating motor 45. The driving force of the rotating motor 45 is transmitted to the rotary shaft 44 via a belt 46 stretched between the pulley 45a and the pulley 44a. Incidentally, in order to prevent the particles generated in the rotary driving mechanism 30 from being attached to the wafer W, the rotary driving mechanism 30 is separated by a wall portion 47 from the space in which the wafer W is inverted.

In the wafer inversion unit (RVS) 14b of the construction described above, the wafer W having the back surface, on which a semiconductor device is not formed, subjected to the cleaning processing is inserted from the main wafer transfer mechanism 15 into the wafer inversion unit (RVS) 14b with the back surface of the wafer W forming the upper surface so as to be transplanted onto the holding member 31a on the support base 31 positioned in the lower portion. Then, the support base 31 having the wafer W disposed thereon is moved upward by the lift mechanism 27 to the positions of the wafer holding arms 36a, 36b that are horizontally held in the open state, followed by closing the wafer holding arms 36a, 36b so as to permit the wafer W to be held by the wafer holding arms 36a, 36b.

In the next step, the support base 31 is retreated to a lower portion so as to prevent the wafer holding arms 36a, 36b from colliding against the support base 31 and the holding member 31a when the wafer W is inverted, followed by driving the rotary driving mechanism 30 so as to swing the wafer W by 180°. Then, the support base 31 is moved upward again with the wafer W held inverted by 180° so as to open the wafer holding arms 36a, 36b and, thus, to transplant the wafer W onto the support base 31. Further, the support base 31 having the wafer W disposed thereon is moved downward so as to transplant the wafer W onto the main wafer transfer mechanism 15. In this stage, the wafer W is inverted such that the front surface, on which a semiconductor device is formed, constitutes the upper surface. The wafer W in the particular state is transferred into, for example, the scrub cleaning units 21a to 21d so as to have the front surface of the wafer W subjected to the cleaning processing.

Where two wafer inversion units (RVS) 14b of the construction described above are arranged as in the embodiment described above, it is possible to use properly each of the two wafer inversion units (RVS) 14b. For example, the lower stage wafer inversion unit (RVS) 14b can be used for inverting the wafer W transferred by the wafer transfer arms 55 to 57 described herein later such that the front surface of the wafer W constitutes the upper surface. Specifically, the lower stage wafer inversion unit (RVS) 14b can be used for inverting the wafer W such that the back surface of the wafer W constitutes the upper surface. On the other hand, the upper stage wafer inversion unit (RVS) 14b can be used for inverting the wafer W transferred by the wafer transfer arms 55 to 57 such that the back surface of the wafer W constitutes the upper surface. Specifically, the upper stage wafer inversion unit (RVS) 14b can be used for inverting the wafer W such that the front surface of the wafer W constitutes the upper surface.

It should also be noted that, since the four scrub cleaning units (SCR) 21a to 21d are arranged in the cleaning processing system 1, it is possible to use the upper stage wafer inversion unit (RVS) 14b for the inversion of the wafer W after the cleaning processing in the upper stage scrub cleaning units (SCR) 21c, 21d, and to use the lower stage wafer inversion unit (RVS) 14b for the inversion of the wafer W after the cleaning processing in the lower stage scrub cleaning units (SCR) 21a, 21b.

Further, it is possible to use the wafer inversion units (RVS) 14b for inversion operation of the wafer W, such as the quite unprocessed wafer W, the wafer W having the back surface alone subjected to the cleaning processing, the wafer W having the front surface alone subjected to the cleaning processing, or the wafer W having both the front surface and the back surface subjected to the cleaning processing, transferred there in accordance with the progress of the cleaning processing. In this case, the main wafer transfer arms 55 to 57 arranged in the main wafer transfer mechanism 15 are controlled to transfer the wafer W into the predetermined wafer inversion unit (RVS) 14b or to transfer the wafer W out of the predetermined wafer inversion unit (RVS) 14b in accordance with a predetermined processing recipe set and stored in advance in the controller of the control box (CB) 19.

It is desirable for a sensor 48 such as an optical sensor serving to detect the state of the wafer W, i.e., to detect whether the wafer W is disposed on an accurate position on the support base 31 or whether the wafer W is held without fail between the wafer holding arms 36a and 36b, to be mounted in the wafer inversion unit (RVS) 14b so as to monitor whether the wafer W is moved without fail. In the case of arranging the particular sensor 48, it is possible to prevent the wafer W from being dropped or broken during the inverting operation of the wafer W.

As shown in FIG. 3, a heating/cooling section (HP/COL) 16 is arranged on the opposite side of the transfer/inversion section 14 with the main wafer transfer mechanism 15 interposed therebetween. The heating/cooling section (HT/COL) 16 includes a cooling unit (COL) 16b for performing a compulsory cooling and three hot plate units (HP) 16a stacked on the cooling unit (COL) 16b for performing a compulsory heating/natural cooling. Openable window portions 96 through which the main wafer transfer arms 55 to 57 can be inserted into and taken out of these units 16b and 16a is formed in the side wall of each of these cooling unit (COL) 16b and the hot plate units (HP) 16a on the side of the main wafer transfer mechanism 15.

It is possible to use the cooling unit (COL) 16b constructed such that, for example, a cooling gas such as a nitrogen gas is spurted from below against a support table 62 provided with a plurality of pins 62a projecting upward from the support table 62 for holding the wafer W in a position close to the upper surface of the support table 62 so as to cool the support table 62 and, thus, to cool uniformly the wafer W. On the other hand, it is possible to use desirably the heating unit (HP) 16a constructed such that the wafer W is held in a position close to the upper surface of a hot plate 63 housing a heater 63a and maintained at a predetermined temperature so as to heat uniformly the wafer W. The heating/cooling section (HP/COL) 16 is used mainly for the drying treatment of the wafer W after the scrub cleaning treatment, which has the front surface or the back surface that has not yet been dried completely.

The scrub cleaning units (SCR) 21a to 21d will now be described. As shown in FIGS. 1 and 2, the scrub cleaning units (SCR) 21a and 21b are arranged on the lower stage, and the scrub cleaning units (SCR) 21c and 21d are stacked on the scrub cleaning units (SCR) 21a and 2ab, respectively. In this fashion, the total of four scrub cleaning units are arranged in two stages each consisting of two scrub cleaning units.

The scrub cleaning units (SCR) 21a to 21d are constructed such that the scrub cleaning unit (SCR) 21b arranged on the side of the wafer transfer section 5 is in symmetry in the construction to the scrub cleaning unit (SCR) 21a arranged adjacent to the scrub cleaning unit (SCR) 21b with-respect to a boundary wall 97a forming one side surface of a sink 68 referred to herein later, and that the scrub cleaning unit (SCR) 21c is in symmetry in the construction to the adjacent scrub cleaning unit (SCR) 21d with respect to a boundary wall 97b in order to permit the main wafer transfer arms 55 to 57 of the main wafer transfer mechanism 15 to be inserted into and withdrawn from the scrub cleaning units (SCR) 21a 21d.

To be more specific, as described herein later in detail with reference to FIGS. 9 and 10, a spin chuck 71 for performing the transfer of the wafer W to and from the main wafer transfer arms 55 to 57 in the scrub cleaning units (SCR) 21a to 21d and for holding the wafer W substantially horizontal is arranged close to the main wafer transfer mechanism 15 in each of the scrub cleaning units (SCR) 21a to 21d. Also, brush holding arms 77a, 77b that are driven to permit brushes 76a, 76b to abut against the upper surface of the wafer W held on the spin chuck 71 are positioned away from the main wafer transfer mechanism 15 . In this fashion, the scrub cleaning units (SCR) 21a and 21b are allowed to be in symmetry in construction with respect to the boundary wall 97a, and the scrub cleaning units (SCR) 21c and 21d are allowed to be in symmetry in construction with respect to the boundary wall 97b as shown in FIG. 1.

Figure 8A:
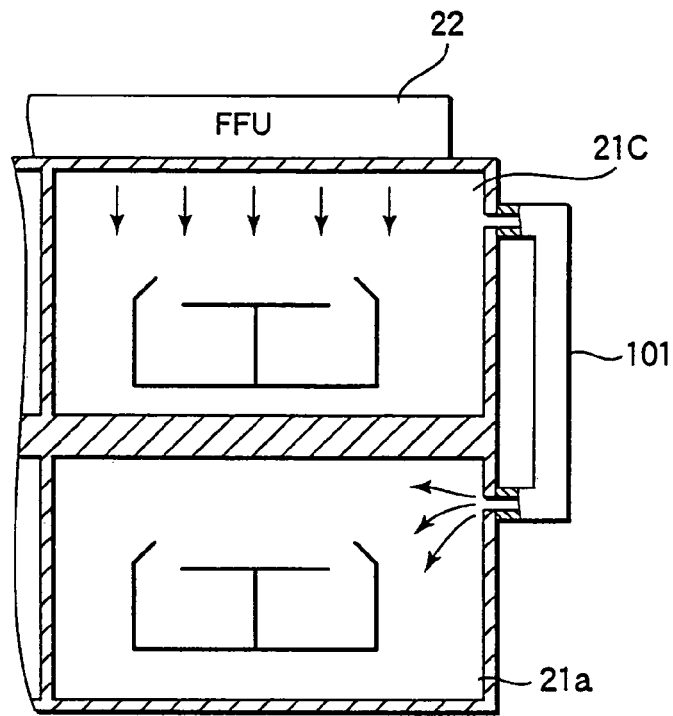
FIGS. 8A and 8B collectively show the drawing mechanism of a clean air into the scrub cleaning unit (SCR) mounted to the cleaning processing system shown in FIGS. 1 to 3.

As shown in FIG. 2, the upper stage scrub cleaning units (SCR) 21c and 21d are arranged immediately below the filter fan unit (FFU) 22 such that a clear air can be introduced into these the upper stage scrub cleaning units (SCR) 21c and 21d. On the other hand, as shown in FIG. 8A, the side wall of the lower stage scrub cleaning unit (SCR) 21a is connected to the side of the upper stage scrub cleaning unit (SCR) 21c via a pipe 101. As a result, the clean air supplied into the upper stage scrub cleaning unit (SCR) 21c is introduced into the lower stage scrub cleaning unit (SCR) 21a through the pipe 101. Likewise, the clean air supplied into the upper stage scrub cleaning unit (SCR) 21d is introduced into the lower stage scrub cleaning unit (SCR) 21b.

As described above, a clean air is introduced from the filter fan unit (FFU) 22 directly into the upper stage scrub cleaning units (SCR) 21c and 21d positioned immediately below the filter fan unit (FFU) 22 so as to make it possible to maintain a high cleanliness within the upper stage scrub cleaning units (SCR) 21c and 21d. On the other hand, it is necessary to introduce the clean air into the lower stage scrub cleaning units (SCR) 21a and 21b through pipes. Naturally, it is considered reasonable to understand that the cleanliness of the lower stage scrub cleaning units (SCR) 21a, 21b is lower than that of the upper stage scrub cleaning units (SCR) 21c, 21d.

Under the circumstances, in the embodiment of the present invention, the upper stage scrub cleaning units (SCR) 21c and 21d are used for the cleaning of the front surface of the wafer W requiring a higher degree of cleanliness, and the lower stage scrub cleaning units (SCR) 21a and 21b are used for the cleaning of the back surface of the wafer W that does not require the cleanliness higher than that on the front surface.

Where the wafer W is held horizontal on the spin chuck 71 described herein later in the scrub cleaning units (SCR) 21a, 21b for the cleaning of the back surface of the wafer W, the front surface of the wafer W constitutes the lower surface. Therefore, used is the spin chuck 71 having a mechanism of mechanically holding the circumferential edge portion of the wafer W so as to prevent the front surface of the wafer W from bearing the trace of having been held by the spin chuck 71.

On the other hand, it is possible to use the spin chuck 71 having a mechanism of mechanically holding the circumferential edge of the wafer W in the scrub cleaning units (SCR) 21c, 21d for cleaning the front surface of the wafer W. However, since the back surface of the wafer W constitutes the lower surface when the wafer W is held substantially horizontal on the spin chuck 71 described herein later, it is possible to use the spin chuck 71 having a mechanism of holding the wafer W by means of the vacuum suction.

Figure 8B:
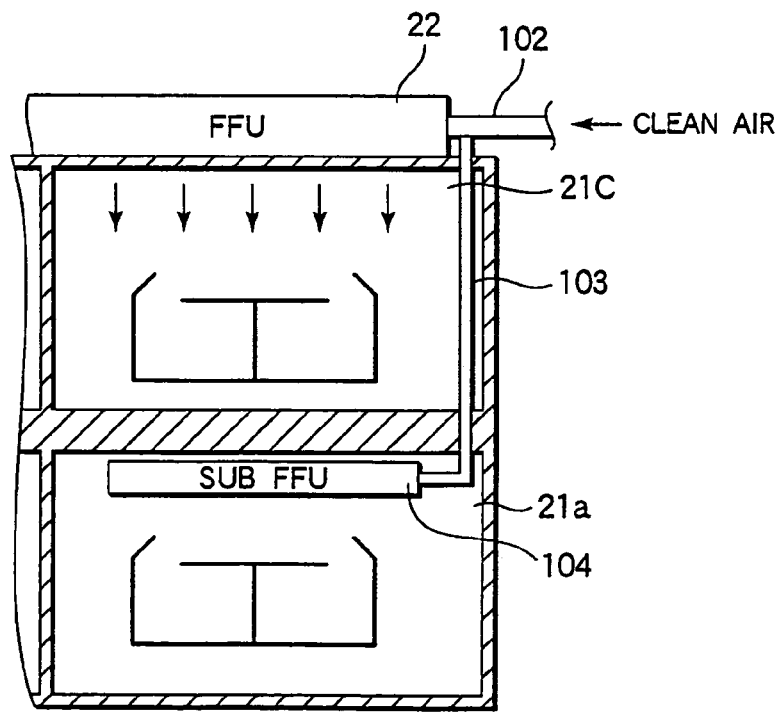

Incidentally, it is possible to arrange a sub-filter unit (SUB FFU) 104 in an upper portion of the lower stage scrub cleaning unit (SCR) 21a, as shown in FIG. 8B. In this case, a pipe 103 extending downward is connected to a pipe 102 for supplying the air into the filter fan unit (FFU) 22, and the air is also supplied to the sub-filter unit (SUB FFU) 104 through the pipe 103. It follows that the air cleaned by the sub-filter unit (SUB FFU) 104 is supplied into the scrub cleaning units (SCR) 21a and 21b so as to maintain a high cleanliness within the scrub cleaning units (SCR) 21a and 21b. In this case, it is possible to use the scrub cleaning units (SCR) 21a to 21d in accordance with the processing recipe that the wafers W are transferred one by one at random into the vacant scrub cleaning unit (SCR) for starting the cleaning processing regardless of the situation as to whether the front surface or the back surface of the wafer W constitutes the upper surface.

The inner construction of the scrub cleaning unit (SCR) in the embodiment of the present invention will now be described in detail.

As described above, the scrub cleaning units (SCR) 21a to 21d are properly used for the cleaning of the back surface and for the cleaning of the front surface of the wafer W in the embodiment of the present invention. However, the scrub cleaning units (SCR) for the cleaning of the front surface of the wafer W are substantially equal to the scrub cleaning units (SCR) for the cleaning of the back surface of the wafer W except the construction of the spin chuck 71. Such being the situation, the construction of the scrub cleaning unit (SCR) 21a for the cleaning of the back surface of the wafer W will now be described as a representative.

Figure 9:
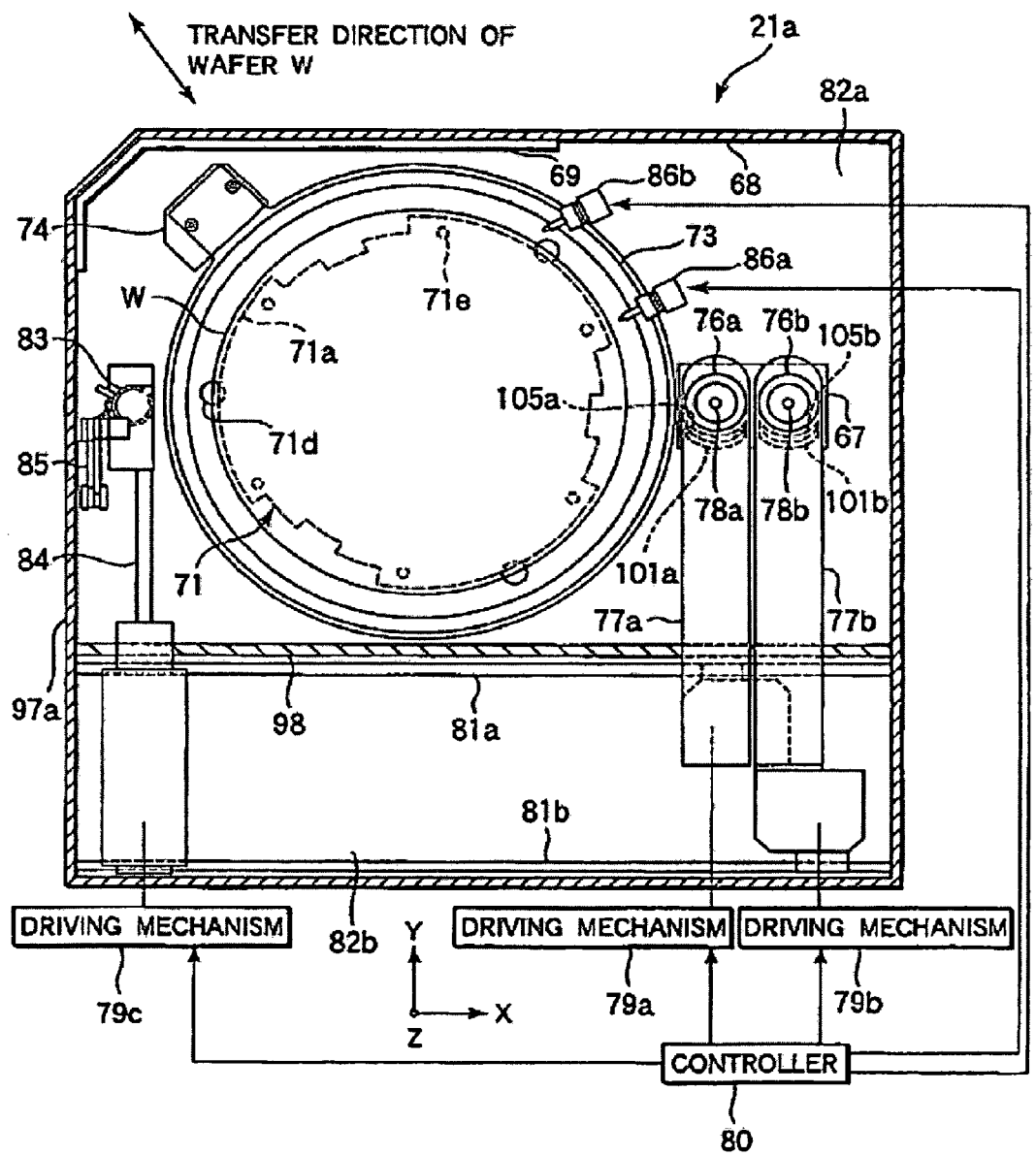
FIG. 9 is a plan view schematically showing the construction of the scrub cleaning unit (SCR)
Figure 10:
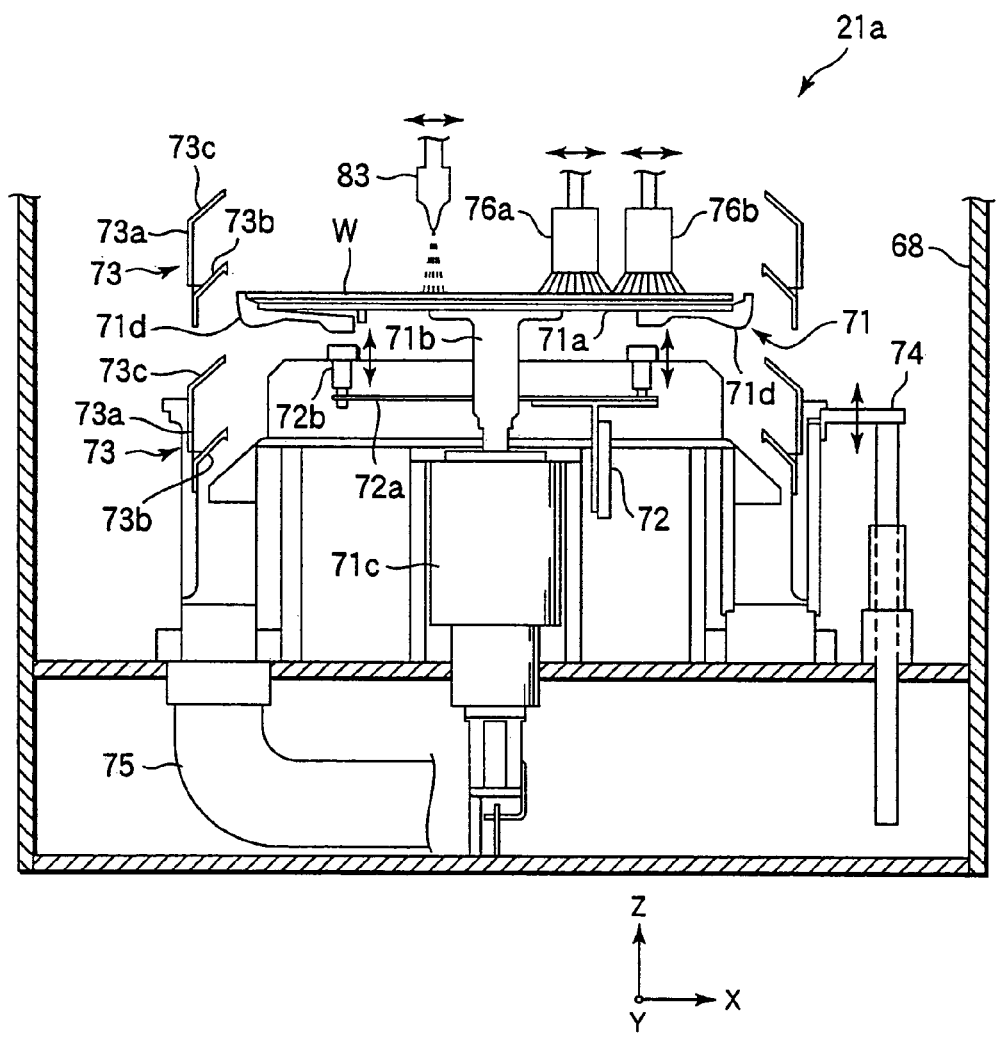
FIG. 10 is a vertical cross sectional view schematically showing the construction of the scrub cleaning unit (SCR) in the X-direction.
Figure 11:
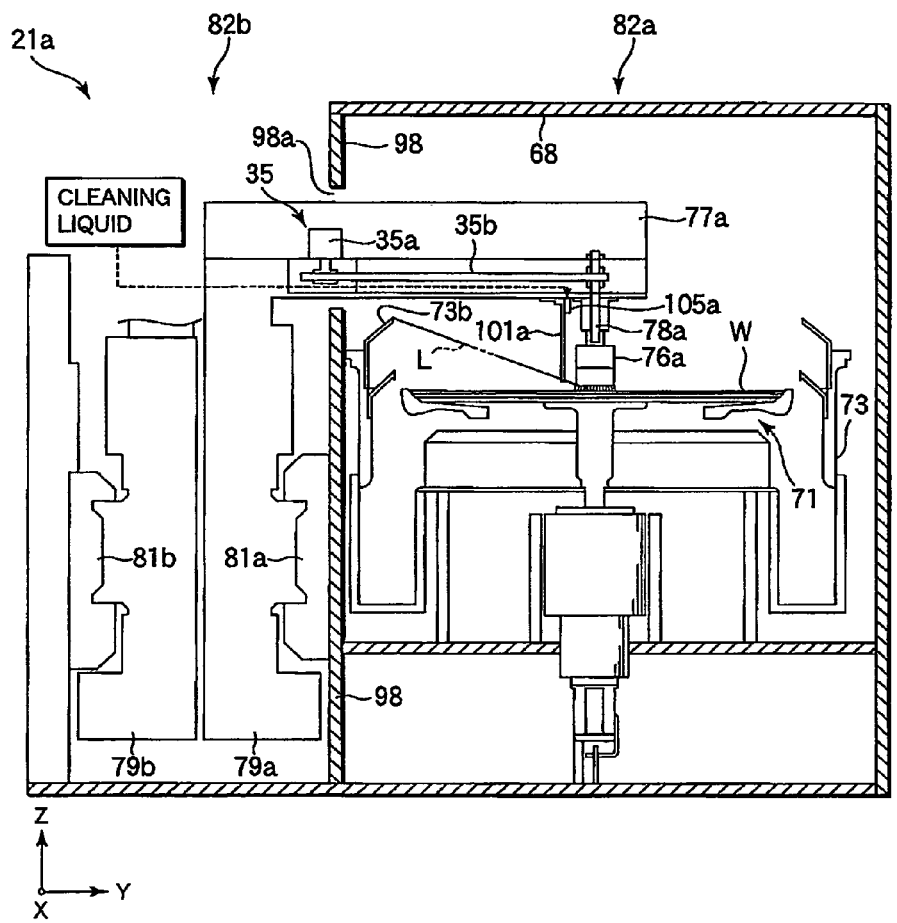
FIG. 11 is a vertical cross sectional view schematically showing the construction of the scrub cleaning unit (SCR) in the Y-direction.

FIG. 9 is a plan view schematically showing the construction of the scrub cleaning unit (SCR) 21a, FIG. 10 is a vertical cross sectional view in the X-direction of FIG. 9, and FIG. 11 is a vertical cross sectional view in the Y-direction of FIG. 9.

The scrub cleaning unit (SCR) 21a comprises a sink 68 performing the function of a casing, the spin chuck 71 for rotatably holding the wafer W, a cup 73 surrounding the wafer W held by the spin chuck 71, two brushes 76a, 76b abutting against the upper surface of the wafer W for cleaning the wafer W, two rinse nozzles 86a, 86b arranged outside the cup 73, and a cleaning liquid spurting nozzle 83 for performing a high speed jet cleaning or a cleaning processing using a cleaning liquid having an ultrasonic wave applied thereto.

Each member of the scrub cleaning unit (SCR) 21a is arranged within the sink 68, and an openable window 69 is arranged in the boundary portion between the sink 68 and the main wafer transfer mechanism 15 such that the main wafer transfer arms 55 to 57 introduced into and taken out of the sink 68 through the openable window 69. Therefore, the spin chuck 71 for holding the wafer W is arranged in the position close to the main wafer transfer mechanism 15.

The spin chuck 71 comprises a chuck plate 71a, a pivot 71b for pivotally supporting the chuck plate 71a, a rotary driving mechanism 71c for rotating the pivot 71b, and an attaching-detaching mechanism 71d for attaching and detaching the wafer W in the chuck plate 71a. Also, a plurality of support pins 71e, i.e., six support pins 71e in FIG. 9, are mounted to the front surface of the chuck plate 71a such that the wafer W is disposed in contact with the tips of these support pins 71e.

An attaching-detaching mechanism 71d of the wafer W is formed in three portions in the circumferential edge of the chuck plate 71a. The state that the attaching-detaching mechanism 71d holds the wafer W is shown on the left side of FIG. 10, and the state that the attaching-detaching mechanism 71d does not hold the wafer W is shown on the right side of FIG. 10. An abutting jig 72b is arranged on a single connecting plate 72a that can be moved in the vertical direction by a lift mechanism 72 in three portions corresponding to the arranging positions of the attaching-detaching mechanisms 71d. If the connecting plate 72a is moved upward by the lift mechanism 72, the abutting jigs 72b arranged at the three portions simultaneously push the inner circumferential edge of the attaching-detaching mechanism 71d against the back surface of the chuck plate 71a, with the result that the outer circumferential edge of the attaching-detaching mechanism 71d is inclined downward so as to release the holding state of the wafer W. By contraries, if the lift mechanism 72 is moved downward so as to move the abutting jig 72b away from the attaching-detaching mechanism 71d, the outer circumferential edge of the attaching-detaching mechanism 71d is inclined upward so as to allow the wafer W to be held by the attaching-detaching mechanism 71d.

Figure 12:
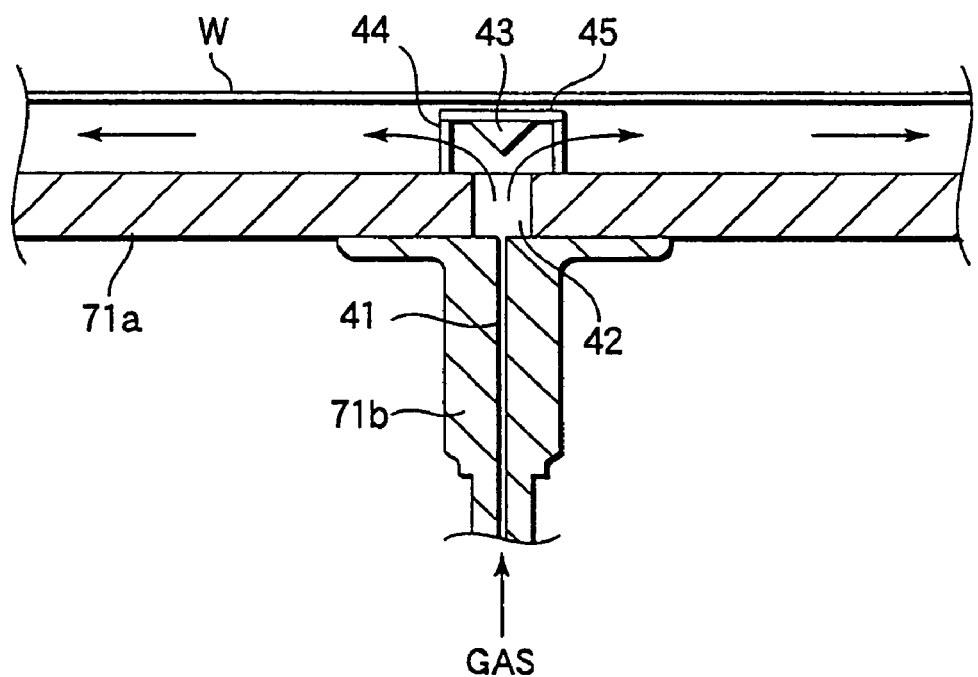
FIG. 12 is a cross sectional view showing the construction of a coupling portion between the chuck plate and the pivot in the spin chuck of the scrub cleaning unit (SCR)

FIG. 12 is a cross sectional view showing in detail the construction of the joining portion between the pivot 71b and the chuck plate 71a. A gas supply hole 41 for supplying a drying gas such as a nitrogen gas toward the wafer W is formed within the pivot 71b. Also, a bore portion 42 is formed in the central portion of the chuck plate 71a in a manner to communicate with the gas supply hole 41. A conical member 43 is arranged above the bore portion 42 such that the tip of the conical member 43 faces downward. In FIG. 12, the conical member 43 is mounted to the lower surface of a plate 45 supported by a leg portion 44. It should be noted, however, it is possible for the conical member 43, the leg portion 44 and the plate 45 to be formed integral. Incidentally, the length of the leg portion 44 is adjusted to prevent the upper surface of the plate 45 from being brought into contact with the lower surface of the wafer W.

The conical member 43 and the plate 45 serve to prevent the drying gas spurted from the gas supply hole 41 toward the wafer W from being blown directly against the wafer W. As shown in the drawing, the drying gas is dispersed by the conical member 43 in the radial direction so as to flow through the clearance between the adjacent leg portions 44 and, thus, to be diffused through the clearance between the lower surface of the wafer W and the upper surface of the chuck plate 71a toward the outer circumferential edge portion of the wafer W. In short, the drying gas spurted from the gas supply hole 41 is spurted in the radial direction of the wafer W. What should be noted is that the drying gas spurted in the radial direction of the wafer W serves to prevent the cleaning liquid in a mist state from permeating into the clearance between the lower surface of the wafer W and the upper surface of the chuck plate 71a and from being attached to the lower surface of the wafer W. It follows that the lower surface of the wafer W is prevented from being contaminated.

The cup 73 is arranged to surround the outer circumferential edge of the chuck plate 71a and can be moved in the vertical direction by a lift mechanism 74. FIG. 10 shows both the lowered position and the elevated position of the cup 73, and FIG. 11 shows the elevated position alone of the cup 73. When the wafer W is transferred into or out of the scrub cleaning unit (SCR) 21a, the cup 73 is held in the lowered position, and is held in the elevated position during the cleaning processing so as to guide the cleaning liquid scattered from the outer circumferential edge portion of the wafer W toward the outside into the lower portion in the inner circumferential surface of the cup 73. The cup 73 includes a cylindrical body 73a, and upper and lower two stage tapered portions consisting of a lower tapered portion 73b and an upper tapered portion 73c each formed to be inclined inward and upward from the inner wall of the cylindrical body 73a. The cup 73 is fixed at a height position at which the cleaning liquid scattered from the wafer W toward the outer circumferential region by the rotation of the wafer W during the cleaning processing collides against the lower stage tapered portion 73b and, then, is guided downward.

As described above, the cleaning liquid generated during the cleaning processing in a mist state is prevented by mainly the lower stage tapered portion 73b from being diffused toward the outside. In addition, the cup 73 includes the upper stage tapered portion 73c formed above the lower stage tapered portion 73b. The upper stage tapered portion 73c further suppresses the scattering of the cleaning liquid in a mist state toward the outside, and also serves to prevent the cleaning liquid colliding against and rebounded from the vertical wall of the cylindrical body 73a or the lower stage tapered portion 73b from being scattered to the outside of the cup 73.

Since the cleaning liquid is prevented from being scattered to the outside of the cup 73 as described above, the inner region of the scrub cleaning unit (SCR) 21a can be kept clean, with the result that the wafer W is unlikely to be contaminated so as to make it possible to obtain the cleaned wafer W of a high quality. It should also be noted that a drain 75 is formed in the bottom portion in the inner circumferential region of the cup 73 so as to discharge the waste gas and the waste cleaning liquid from within the cup 73.

Figure 13:
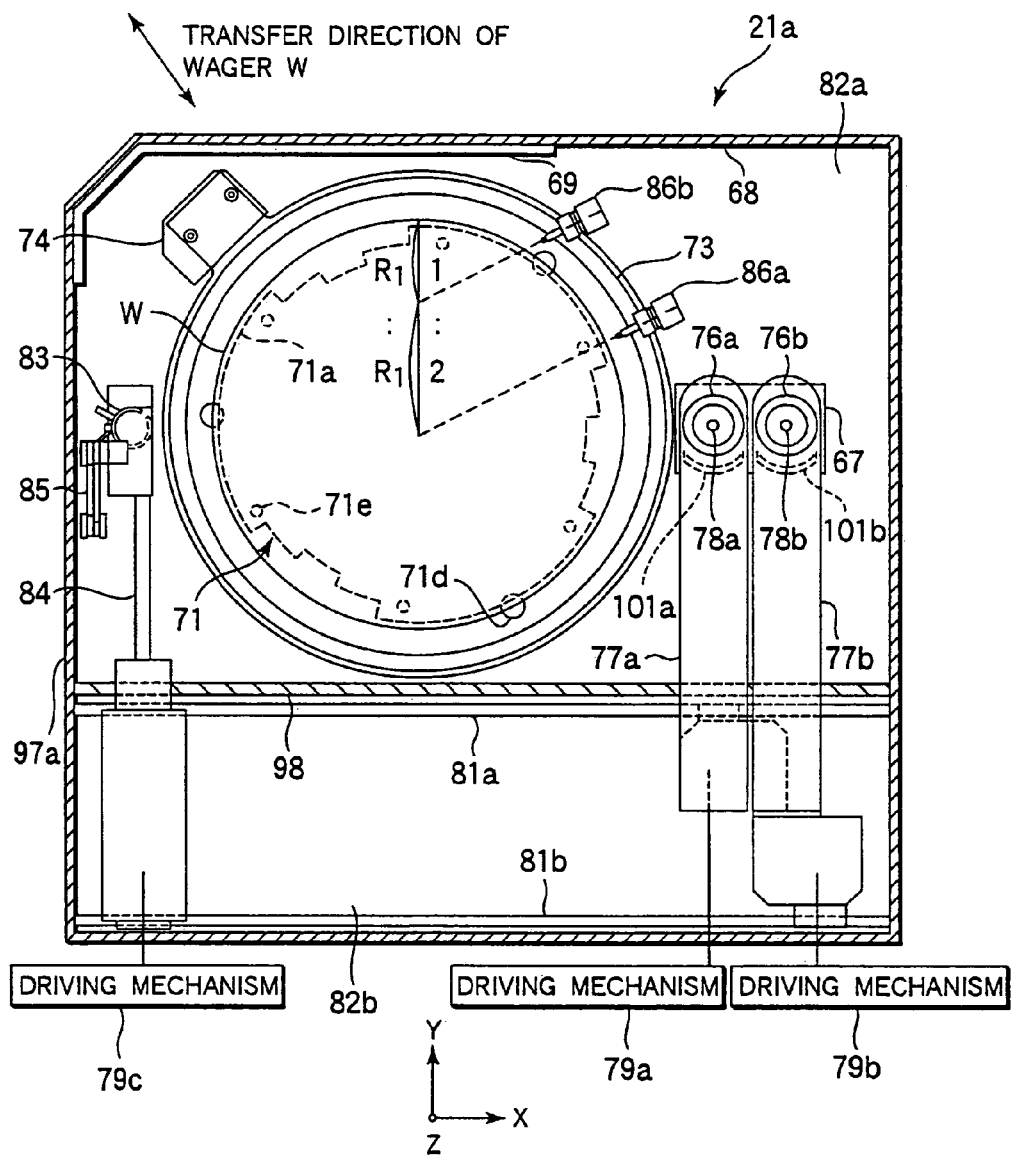
FIG. 13 is a plan view for explaining a desired spurting direction of a cleaning liquid or a rinsing liquid spurted from a rinse nozzle in the scrub cleaning unit (SCR)

The rinse nozzles 86a and 86b referred to previously are arranged in predetermined positions outside the cup 73 so as to supply a cleaning liquid or a rinsing liquid to predetermined positions of the wafer W respectively, thereby forming a liquid film on the wafer W. In order to apply a uniform cleaning processing to the entire region of the wafer W, it is necessary to make uniform the liquid film formed on the wafer W. For forming a uniform liquid film on the wafer W, it is desirable to construct the scrub cleaning unit (SCR) 21a such that a cleaning liquid or a rinsing liquid is spurted from the rinse nozzle 86a toward substantially the center of the wafer W and that a cleaning liquid or a rinsing liquid is spurted from the rinse nozzle 86b toward a predetermined position outside the central portion of the wafer W. In this case, it is possible to form a uniform liquid film on the wafer W with a small spurting amount of the cleaning liquid or the rinsing liquid, if the cleaning liquid or the rinsing liquid is spurted from the rinse nozzle 86b toward the point at which the radius R of the wafer W is divided into portion $R_1$ on the side of the center and portion $R_2$ on the side of the outer periphery of wafer W at a ratio of 2:1, i.e., $R_1:R_2=2:1$ as shown in FIG. 13. As shown in FIG. 9, the spurting amounts of the cleaning liquid or the rinsing liquid from the rinse nozzles 86*a* and 86*b* are controlled by a controller 80.

Where a uniform liquid film is formed, it is possible to perform a uniform cleaning processing over the entire region of the wafer W in the step of applying the scrub cleaning by using the brushes 76*a* and 76*b*. It is also possible to perform a uniform rinsing operation over the entire region of the wafer W in the rinsing operation performed after the scrub cleaning and before the spin drying operation. The quality of the cleaned wafer W can be improved by spurting the cleaning liquid or the rinsing liquid onto the optimum position. Also, since the cleaning liquid or the rinsing solution can be used effectively, it is possible to lower the consumption of the cleaning liquid or the rinsing liquid so as to lower the running cost.

Incidentally, it is desirable to arrange the rise nozzles 86*a*, 86 such that the spurting directions of the cleaning liquid spurted from the rinse nozzles 86*a*, 86*b* are rendered substantially parallel from the view point of forming a uniform liquid film, as shown in FIG. 9. However, if it is possible to obtain an allowable uniformity of the liquid film formed on the wafer W, the spurting directions are not necessarily limited.

It should be noted that, if the cleaning liquid is continuously spurted from the rinse nozzle 86*a* when the brushes 76*a*, 76*b*, which are allowed to abut against the wafer W, are scanned in the X-direction in a manner to cross the wafer W, it is expected that the cleaning liquid may collide directly against the brushes 76*a*, 76*b* so as to be diffused when the brushes 76*a*, 76*b* pass through the central portion of the wafer W. Under the circumstances, it is desirable to control the timing of spurting the cleaning liquid by the controller 80 such that, for example, the brushes 76*a*, 76*b* are scanned preferentially so as to prevent the cleaning liquid from directly colliding against the brushes 76*a*, 76*b* in accordance with the movement of the brushes 76*a*, 76*b*.

The two brushes 76*a*, 76*b* are arranged above the spin chuck 71 and allowed to abut against the upper surface of the wafer W for performing the scrub cleaning. The material of those portions of the brushes 76*a*, 76*b* which are actually allowed to abut against the wafer W is not particularly limited. For example, it is possible to use a brush-like material or a puff-like or a sponge-like material for forming the brushing portion directly abutting against the wafer W. The brushes 76*a*, 76*b* are mounted to the tip portions of the brush holding arms 77*a*, 77*b* such that, when the brush holding arms 77*a*, 77*b* are driven, the brushes 76*a*, 76*b* are allowed to pass through the center of the wafer W.

As shown in FIG. 11, the brush 76*a* can be rotated about a rotary shaft 78*a* extending in the Z-direction by a rotation driving mechanism 35 in which the rotary driving force of, for example, a motor 35 arranged in the brush holding arm 77*a* is transmitted to the rotary shaft 78*a* via a belt 35*b*. Likewise, the brush 76*b* can be rotated about a rotary shaft 78*b* extending in the Z-direction by the rotation driving mechanism 35. Incidentally, the rotary driving mechanism of the brushes 76*a*, 76*b* can be constructed such that the rotary shaft of the motor coincides with the rotary shaft 78*a* of the brush 76*a* so as to drive directly the brushes 76*a*, 76*b* without using a belt.

FIG. 9 shows the state that the two brush holding arms 77*a*, 77*b* are in the retreat positions outside the cup 73. As shown in the drawing, the brushes 76*a*, 76*b* in the retreat positions are positioned above a brush bath 67 such that the cleaning liquid dripping down from the brushes 76*a*, 76*b* is collected in the brush bath 67. Also, when brush covers 101*a*, 101*b* are cleaned by using a brush cover cleaning mechanism 105*a*, 105*b* referred to herein later in the retreat positions of the brushes 76*a*, 76*b*, the cleaning liquid after the cleaning processing is collected in the brush bath 67.

Cleaning liquid supply nozzles (not shown) for supplying a predetermined cleaning liquid to the brushes 76*a*, 76*b* are mounted to the tip portions of the brush holding arms 77*a*, 77*b*. During the scrub cleaning using the brushes 76*a*, 76*b*, a predetermined amount of the cleaning liquid is supplied from these cleaning liquid supply nozzles into the brushes 76*a*, 76*b* in addition to the supply of the cleaning liquid from the rinse nozzles 86*a*, 86*b* described previously onto the wafer W.

In order to prevent the cleaning liquid from being scattered toward the proximal ends of the brush holding arms 77*a*, 77*b*, the brush covers 101*a*, 101*b* are arranged outside the brushes 76*a*, 76*b* on the side of the proximal ends of the brush holding arms 77*a*, 77*b* in a manner to surround a part of the outer circumferential surface of the brushes. It is desirable to arrange these brush covers 101*a*, 101*b* in positions where the cleaning liquid discharged from the rinse nozzles 86*a*, 86*b* do not collide directly against these brush covers 101*a*, 101*b* in a manner to cover partly the outer circumferential surfaces of the brushes 76*a*, 76*b*. If the cleaning liquid collides directly against the brush covers 101*a*, 101*b*, the cleaning liquid is scattered, resulting in failure to form a uniform liquid film on the wafer W.

As shown in FIG. 11, the brush cover 101*a* is arranged such that the lower end of the brush cover 101*a* is positioned below line L joining the center of the wafer W held on the spin chuck 71 and the upper end of the cup 73, i.e., the upper end of the upper stage tapered portion 73*b*. In this case, the cleaning liquid scattered from the contact region between the brush 76*a* and the wafer W and from the outer circumferential surface of brush 76*a* is intercepted by the brush cover 101*a* so as to be prevented from being scattered to the outside through the free space above the tapered portion of the cup 73. It follows that it is possible to keep clean the inner space of the scrub cleaning unit (SCR) 21*a*. Also, since the cleaning liquid is prevented from being scattered toward a window portion 98*a* formed in a partition wall 98 described herein later and is also prevented from entering a driving mechanism arranging chamber 82*b* through the window portion 98*a*, it is possible to avoid the difficulty that the cleaning liquid is attached to arm driving mechanisms 79*a*, 79*b* so as to cause defective operations of the arm driving mechanisms 79*a*, 79*b*.

It is desirable for each of the brush covers 101*a*, 101*b* to have a substantially arcuate cross sectional shape. If the brush covers 101*a*, 101*b* have the particular cross sectional shape, it is possible to avoid the difficulty that the cleaning liquid colliding against the brush covers 101*a*, 101*b* is rebounded from the brush covers 101*a*, 101*b* in the form of smaller mist particles so as to be scattered inside the cup 73.

It is also desirable to arrange a brush cover cleaning mechanism 105*a*, 105*b* on the surface of each of the brush covers 101*a*, 101*b* for supplying a predetermined cleaning liquid. If a predetermined cleaning liquid flows along the surface of each of the brush covers 101*a*, 101*b* during the cleaning processing using the brushes 76*a*, 76*b*, the cleaning liquid colliding against the brush covers 101*a*, 101*b* is mixed with the cleaning liquid supplied by the brush cover cleaning mechanism 105*a*, 105*b* so as to be guided downward, with the result that the mist generation is suppressed. On the other hand, the brush covers 101*a*, 101*b* can be cleaned by allowing a cleaning liquid to flow along the surfaces of the brush covers 101*a*, 101*b* when the brushes 76*a*, 76*b* are in the waiting positions above the brush bath 67, with the result that the brush covers 101*a*, 101*b* can be kept clean.

As shown in FIGS. 9 and 11, the proximal end portion of the brush holding arm 77*a* is joined to the arm driving mechanism 79a, and the brush holding arm 77a can be slid by the arm driving mechanism 79a in parallel in the X-direction along a guide 81a. Also, the proximal end portion of the brush holding arm 77b is joined to the arm driving mechanism 79b, and the brush holding arm 77b can be slid by the arm driving mechanism 79b in parallel in the X-direction along a guide 81b. As described above, even where the plural brush arm holding arms 77a, 77b are arranged, these brush holding arms 77a, 77b are driven in the same direction, i.e., X-direction, so as to be moved horizontal in the embodiment of the present invention. It follows that it is possible to drive the brush holding arms 77a, 77b independently and easily. It is also possible to arrange these brush holding arms 77a, 77b in a single portion so as to diminish the space occupied by the scrub cleaning unit (SCR) 21a. It should be noted that the arm driving mechanisms 79a, 79b are controlled independently by the controller 80.

The arm driving mechanisms 79a, 79b also perform the function of a lift mechanism for moving the brush holding arms 77a, 77b in the Z-direction, and the height of the brushes 76a, 76b can be adjusted by the lift mechanism. Incidentally, it is possible to mount a mechanism for moving the brushes 76a, 76b in the Z-direction to the tip portions of the brush holding arms 77a, 77b holding the brushes 76a, 76b.

In the scrub cleaning unit (SCR) 21a, it is possible to perform the cleaning processing by simultaneously driving the two brush holding arms 77a, 77b so as to be scanned in the X-direction in a manner to allow the brushes 76a, 76b to abut against different positions of the wafer W, while supplying a cleaning liquid from the rinse nozzles 86a, 86b arranged in the vicinity of the outer surface of the cup 73 onto a predetermined position on the surface of the wafer W so as to form a uniform liquid film, with the spin chuck 71 kept rotated. In this case, it is possible to shorten the cleaning processing time of a single wafer W.

It is also possible for those portions of, for example, the brushes 76a, 76b which abut against the wafer W to be formed of different materials so as to use one of these brushes 76a, 76b for the rough cleaning and to use the other brush for the finish cleaning, thereby achieving a more precise cleaning. Further, it is possible to use one of these brushes 76a, 76b as a spare brush so as to cope with the situation that the other brush is rendered unusable by, for example, disorder or wearing.

As shown in FIGS. 9 and 11, the sink 68 is partitioned by the partition wall 98 into the cleaning processing chamber 82a in which is arranged the cup 73, and the driving mechanism arranging chamber 82b in which are arranged the arm driving mechanisms 79a, 79b, of the brush holding arms 77a, 77b. The brush holding arms 77a, 77b are arranged to extend into the cleaning processing chamber 82a through the window portion (open portion) 98a formed in the partition wall 98 as shown in FIG. 11. The Window portion 98a is formed to have a predetermined opening width in the Z-direction and to extend in the X-direction so as not to obstruct the movement of the brush holding arms 77a, 77b in the Z-direction and the scanning in the X-direction.

Since the sink 68 is partitioned into the cleaning processing chamber 82a and the driving mechanism arranging chamber 82b, it is possible to avoid the problem that the particles, etc. that must have been generated from the arm driving mechanisms 79a, 79b are scattered toward the cleaning processing chamber 82a so as to be attached to the wafer W, with the result that it is possible to maintain a high quality of the cleaned wafer W. Also, where the cleaning liquid is scattered to the outside of the cup 73, it is possible to avoid the problem that the scattered cleaning liquid is attached to the arm driving mechanisms 79a, 79b so as to bring about a malfunction of the arm driving mechanisms 79a, 79b. As described previously, the brush covers 101a, 101b serve to suppress the scattering of the cleaning liquid toward the window portion 98a. To be brief, the partition wall 98 and the brush covers 101a, 101b collectively serve to suppress the attachment of the cleaning liquid to the arm driving mechanisms 79a, 79b.

As described previously, the cleaning liquid discharge nozzle 83 performs the cleaning processing using a high speed jet cleaning liquid or a cleaning liquid having an ultrasonic wave imparted thereto. The particular cleaning liquid discharge nozzle 83 can be scanned by an arm driving mechanism 79c in the X-direction along the guide 81a and is mounted to the tip of a nozzle holding arm 84 movable in the Z-direction. It is also possible to change the height in the Z-direction and the spurting direction of the rinsing liquid of the cleaning liquid spurting nozzle 83 by operating a height/direction adjusting mechanism 85. As described above, the scrub cleaning unit (SCR) 21a is provided with the cleaning means for performing the scrub cleaning using the brushes 76a, 76b and with an additional cleaning means of a different cleaning mode. It follows that the scrub cleaning unit (SCR) 21a is capable of performing the cleaning processing having a high degree of freedom such as the cleaning processing using one of the cleaning means selected depending on the kind of the wafer W, the cleaning processing using the both cleaning means successively, and the cleaning processing using the both cleaning means simultaneously.

Like the arm driving mechanisms 79a, 79b, the arm driving mechanism 79c is arranged within the driving mechanism arranging chamber 82b. Also, like the brush holding arms 77a and 77b, the nozzle holding arm 84 is arranged such that the distal end portion of the nozzle holding arm 84 extends through the window portion 98a formed in the partition wall 98 so as to be positioned within the cleaning processing chamber 82a. It follows that the particles generated from the arm driving mechanism 79c is prevented from being scattered into the cleaning processing chamber 82a. On the other hand, it is possible to avoid the problem that the cleaning liquid is scattered from the cup 73 into the driving mechanism arranging chamber 82b so as to be attached to the arm driving mechanism 79c. It follows that it is possible to avoid the problem that a defective operation of the arm driving mechanism 79c is generated.

It should also be noted that, since each of the arm driving mechanisms 79a to 79c is constructed to have the same driving type that the arm is slid in the X-direction, it is possible to arrange the arm driving mechanisms 79a to 79c in a single portion of the driving mechanism arranging chamber 82b. It follow that it is possible to diminish the arranging space while maintaining the independent driving capability of the brush holding arms 77a, 77b and the nozzle holding arm 84 and while maintaining the cleanliness of the cleaning processing chamber 82a. Incidentally, the arm driving mechanism 79c is also controlled by the controller 80.

The cleaning processing step of the wafer W in the cleaning processing system 1 described above will now be described, covering the case where the cleaning processing is performed in accordance with the process recipe that the front surface of the wafer W is cleaned first, followed by cleaning the back surface of the wafer W. The following description covers the case where the two wafer transit units (TRS) 14a are used such that the lower stage wafer transit unit (TRS) 14a is used for the transfer of the wafer W from the wafer transfer section 5 into the cleaning processing section 3, and the upper stage wafer transit unit (TRS) 14*a* is used for the transfer of the wafer W from the cleaning processing section 3 into the wafer transfer section 5.

Also used are two wafer inversion units (RVS) 14*b* such that the lower stage wafer inversion unit (RVS) 14*b* is used for inverting the wafer W such that the wafer W having the front surface forming the upper surface is inverted into the state that the back surface of the wafer W constitutes the upper surface, and that the upper stage wafer inversion unit (RVS) 14*b* is used for inverting the wafer W such that the wafer W having the back surface forming the upper surface is inverted into the state that the front surface of the wafer W constitutes the upper surface.

Further, used are the four scrub cleaning units (SCR) 21*a* to 21*d* such that the lower stage scrub cleaning units (SCR) 21*a*, 21*b* are used for cleaning the back surface of the wafer W, and that the upper stage scrub cleaning units (SCR) 21*c*, 21*d* are used for cleaning the front surface of the wafer W. The main wafer transfer arms 55 to 57 of the main wafer transfer mechanism 15 are controlled to operate in accordance with the process recipe set and stored in advance in the controller of the control box (CB) 19 so as to perform the transfer of the wafer W among the units having the contents of the processing assigned thereto as described above.

In the first step, the carrier C having a predetermined number of wafers W housed therein is disposed in a predetermined position of the table 11 such that the wafer transfer port of the carrier C is positioned on the side of the wafer transfer section 5. Then, the window portion 92 is opened by the window portion opening-closing mechanism 12 and, where a lid is mounted to the wafer transfer port of the carrier C, the lid is moved so as to allow the inner region of the carrier C to communicate with the wafer transfer section 5. Further, the housed state of the wafers W within the carrier C is confirmed by using a sensor. Where the housed state of the wafers W has been found to be abnormal, the processing is interrupted and the processing operation for another carrier C is started.

Where an abnormality has not been found in the housed state of the wafers W, the wafer holding arm 13*a* of the wafer transfer mechanism 13 is inserted into a predetermined height position within the carrier C so as to take one wafer W out of the carrier C. The wafer W thus held by the wafer holding arm 13*a* is transferred into the lower stage wafer transit unit (TRS) 14*a* so as to be disposed in a predetermined position within the wafer transit unit (TRS) 14*a*. In this stage, the wafer W is in the state that the front surface constitutes the upper surface. Then, the wafer transfer mechanism 13 continues to perform the operation of taking out another wafer W.

In the next step, one of the main wafer transfer arms 55 to 57 of the main wafer transfer mechanism 15, e.g., the main wafer transfer arm 55, is inserted into the lower stage wafer transit unit (TRS) 14*a* having the wafer W disposed thereon so as to take out the wafer W. Since the wafer W is held on the main wafer transfer arm 55 under the state that the front surface constitutes the upper surface, the wafer W is transferred into any one of the upper stage scrub cleaning units (SCR) 21*c* and 21*c* in accordance with the process recipe so as to have the upper surface of the wafer W subjected to the cleaning processing.

In order to clean the back surface of the wafer W after completion of the cleaning on the front surface of the wafer W, it is necessary to turn the wafer W upside down such that the back surface of the wafer W constitutes the upper surface. Therefore, the wafer transfer arm 55 holding the wafer W is transferred into the lower stage wafer inversion unit (RVS) 14*b* so as to transfer the wafer W onto the support base 31. The support base 31 having the wafer W disposed thereon is moved upward by driving the lift mechanism 27 to a position where the wafer holding arms 36*a*, 36*b* are held in an open state, followed by closing the wafer holding arms 36*a*, 36*b*. It is confirmed by the sensor 48 that the wafer W has been held by the wafer holding arms 36*a*, 36*b* and, then, the support base 31 is moved downward to a position where the inverting operation of the wafer W is not obstructed by the support base 31. Under this condition, the wafer holding arms 36*a*, 36*b* are inverted by 180° by the rotary driving mechanism 30 and, thus, the back surface of the wafer W is allowed to constitute the upper surface. Under the state that the back surface of the wafer W constitutes the upper surface, the support base 31 is moved upward again to the position where the wafer W can be transferred, and the wafer holding arms 36*a*, 36*b* are opened so as to dispose again the wafer W on the support base 31.

In the next step, the support base 31 is moved downward, and, for example, the main wafer transfer arm 55 is inserted into the wafer inversion unit (RVS) 14*b* so as to have the wafer W transferred onto the main wafer transfer arm 55. The main transfer arm 55 transfers the wafer W having the back surface constituting the upper surface into any one of the scrubs cleaning units (SCR) 21*a* and 21*b*. The cleaning processing is performed in the scrub cleaning units (SCR) 21*a*, 21*b* as in the scrub cleaning units (SCR) 21*c*, 21*d* for cleaning the front surface of the wafer W.

As described above, the scrub cleaning units (SCR) 21*a*, 21*b* for cleaning the back surface of the wafer W are substantially equal in construction to the scrub cleaning units (SCR) 21*c*, 21*d* for cleaning the upper surface of the wafer W except the construction of the chuck. In each of the scrub cleaning units (SCR) 21*a* to 21*d*, the cleaning processing is carried out as follows.

The openable window 69 is opened under the state that the cup 73 is held in the lower stage position so as to insert the main wafer transfer arm 55 into the position of the spin chuck 71 so as to dispose the wafer W on the spin chuck 71 and is fixed. Then, the main wafer transfer arm 55 is retreated from within the scrub cleaning unit (SCR), followed by closing the openable window 69 and starting the cleaning processing.

Where the scrub cleaning is performed by using both the brushes 76*a* and 76*b*, the brush holding arms 77*a*, 77*b* are slid to permit the brushes 76*a*, 76*b* to be positioned above the wafer W. Also, the cup 73 is moved upward to a predetermined position and held at the predetermined position. Then, the spin chuck 71 is rotated to permit the wafer W to make a planar rotation. Under this condition, a cleaning liquid is supplied from the rinse nozzles 86*a*, 86*b* onto the wafer W so as to form a liquid film on the wafer W. Further, the brushes 76*a*, 76*b*, which are kept rotated, are allowed to abut against the wafer W while supplying the cleaning liquid from the rinse nozzles 86*a*, 86*b* onto the wafer W, and the brush holding arms 77*a*, 77*b* are scanned at a predetermined speed, thereby performing the scrub cleaning.

During the scrub cleaning treatment, a nitrogen gas or the like is spurted from the gas supply hole 41 toward the central portion in the lower surface of the wafer W. The nitrogen gas or the like spurted from the gas supply hole 41 is diffused toward the circumferential edge portion of the wafer W through the clearance between the lower surface of the wafer W and the upper surface of the chuck plate 71*a*, with the result that it is possible to prevent effectively the cleaning liquid in a mist state from being attached to the lower surface of the wafer W and to the upper surface of the chuck plate 71*a*. It is desirable to perform continuously the spurting of the nitrogen gas or the like until the spin drying described herein later is finished.

In the scrub cleaning treatment described above, the linear velocity of rotation is small in the central portion of the wafer W, and the linear velocity of rotation is large in the peripheral portion of the wafer W. Therefore, when the brush holding arms 77a, 77b are scanned in the X-direction, the time during which the brushes 76a, 76b are in contact with an optional unit area of the wafer W can be made uniform over the entire region of the wafer W by, for example, increasing the scanning speed in the central portion of the wafer W and decreasing the scanning speed in the peripheral portion of the wafer W, thereby performing a uniform cleaning processing over the entire region of the wafer W.

After completion of the scrub cleaning using the brushes 76a, 76b, the brushes 76a, 76b are retreated from the cup 73 so as to be positioned above the brush bath 67. Instead, the nozzle holding arm 84 is moved into the cup 73 so as to carry out the cleaning processing in which the nozzle holding arm 84 is scanned in the X-direction while spurting a high speed cleaning liquid or a cleaning liquid having an ultrasonic wave applied thereto from the cleaning liquid spurting nozzle 84 toward the upper surface of the rotating wafer W. Also, it is possible to carry out the cleaning using the cleaning liquid spurting nozzle 83 simultaneously with the scrub cleaning performed by using the brushes 76a, 76b. In this case, the brushes 76a, 76b are reciprocated within the range of the right side half in the X-direction of the wafer W under the state shown in FIG. 9, with the cleaning liquid spurting nozzle 83 being reciprocated within the range of the left half of the wafer W. It should be noted, however, that it is not absolutely necessary to perform both the scrub cleaning using the brushes 76a, 76b and the cleaning using the cleaning liquid spurting nozzle 83.

It is also possible to perform the cleaning processing by using only one brush. In this case, the scrub cleaning is performed similarly by using the brush 76a, with the brush 76b, which is positioned remote from the cup 73, held positioned above the brush bath 67.

After completion of the cleaning processing described above, performed is a spin drying operation in which the wafer W is rotated at a predetermined rotating speed, with the nozzle holding arm 84 held outside the cup 73, so as to centrifugally remove the cleaning liquid attached to the wafer W. Incidentally, it is desirable to apply, before the spin drying treatment, a rinsing treatment to the wafer W by supplying a predetermined rinsing solution from the rinse nozzles 86a, 86b onto the rotating wafer W.

After the spin drying treatment, the cup 73 is moved down. Also, the vacuum suction mechanism of the spin chuck 71 is released. Further, the openable window 69 is opened so as to insert, for example, the maim wafer transfer arm 55 into the scrub cleaning unit (SCR) so as to receive the wafer W after the cleaning processing. The wafer W thus transferred out of the scrub cleaning unit (SCR) is transferred into, for example, any one of the three hot plate units (HP) 16a so as to be dried. Further, the wafer W is transferred as required into the cooling unit (COL) 16b by the main wafer transfer arm 55 so as to be cooled and is brought back again onto the main wafer transfer arm 55.

The wafer W having the front and back surfaces subjected to the cleaning processing and also subjected to the drying treatment is in the state that the back surface constitutes the upper state. Therefore, in order to bring the wafer W back into the carrier C, it is necessary to apply an inverting operation to the wafer W. For the inverting operation, the wafer W is transferred into, for example, the upper stage wafer inversion unit (RVS) 14b by using the main wafer transfer arm 55. In the upper stage wafer inversion unit (RVS) 14b, the wafer W is turned upside down by the operation similar to the inverting operation performed in the lower stage wafer inversion unit (RVS) 14b. As a result, the wafer W having the front surface constituting the upper surface is brought back to, for example, the main wafer transfer arm 55.

The wafer W held by the main wafer transfer arm 55 under the state that the front surface constitutes the upper surface is transferred into the upper stage wafer transit unit (TRS) 14a and, then, further transferred from within the wafer transit unit (TRS) 14a into the wafer transfer section 5 by the wafer holding arm 13a. Finally, the wafer W is housed in a predetermined position within the carrier C. After the series of processing applied to a single wafer W as described above has been applied to all the wafers W housed in the carrier C, the carrier C housing the processed wafers W is transferred into the next process.

In the process step described above, the same main wafer transfer arm 55 is used for a wafer transfer operation within the cleaning processing section 3. In the wafer transfer process, however, it is possible to select any of the main wafer transfer arms 55 to 57, which is not used, for the wafer transfer operation.

In the cleaning processing system 1 according to the embodiment of the present invention described above, the scrub cleaning units (SCR) 21a to 21d are arranged side by side and stacked one upon the other such that the scrub cleaning units (SCR) 21c and 21d are stacked on the scrub cleaning units (SCR) 21a and 21b, respectively, which are arranged side by side. The particular arrangement makes it possible suppress the increase in the footprint to the minimum level even where the wafer W to be processed has a large diameter. Also, the scrub cleaning units (SCR) 21a to 21d can be easily arranged in the existing clean room. Also, since the arranging space of the cleaning processing apparatus is small, the facility cost can be lowered even where it is necessary to modify or enlarge the clean room. Further, since the scrub cleaning units (SCR) are classified into the scrub cleaning units (SCR) 21c, 21d for cleaning the front surface of the wafer W and the scrub cleaning units (SCR) 21a, 21b for cleaning the back surface of the wafer W it is possible to further improve the quality of the wafer W. What should also be noted is that a plurality of scrub cleaning units (SCR) are stacked one upon the other as described above. In addition, a plurality of the same kinds of units are arranged in respect of the transit units (TRS) 14a, the inversion units (RVS) 14b, the heating unit (HP) 16a and the cooling unit (COL) 16b, with the result that the through-put can be shortened easily. Also, since a plurality of the same kinds of the units are stacked one upon the other to form a multi-stage structure, the footprint can be further decreased. Further, it is possible to suppress the attachment of the particles to the substrate so as to maintain a high quality of the substrate by using properly a plurality of these units in accordance with the process step.

Figure 14:
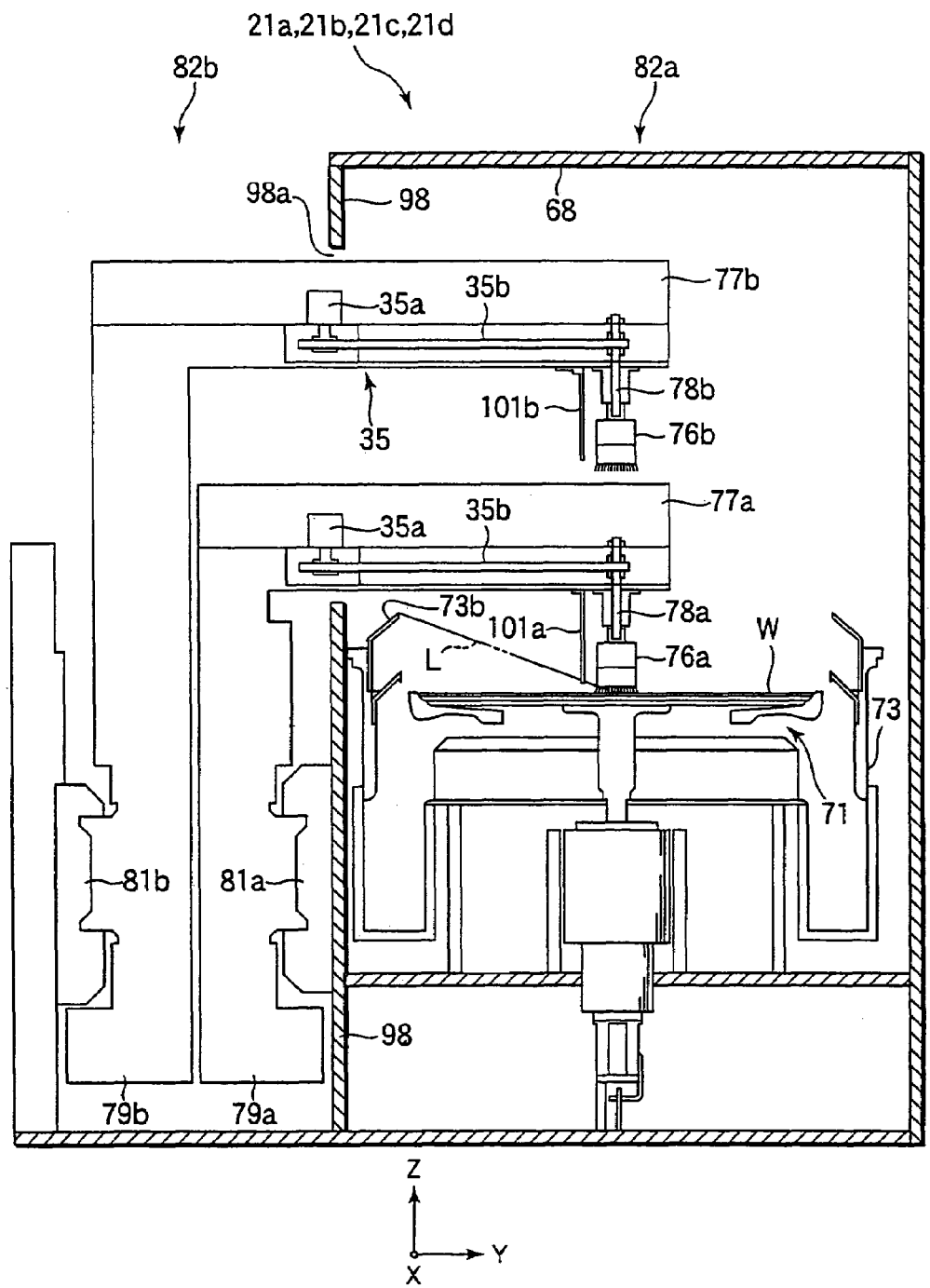
FIG. 14 is a vertical cross sectional view showing the construction in the Y-direction, which permits one brush holding arm to outrun the other brush holding arm, in the scrub cleaning unit (SCR)

Another cleaning mode of the scrub cleaning unit (SCR) will now be described. As described above, the brush holding arms 77a, 77b can be moved in the Z-direction by the arm driving mechanisms 79a, 79b in the scrub cleaning unit (SCR). Therefore, even if the brush holding arm 77b is scanned in the X-direction, it is possible to prevent the brush holding arm 77b from colliding against the brush holding arm 77a by allowing the brush 76a to abut against the wafer W and by holding the brush 76b in an upper portion, as shown in FIG. 14. In other words, it is possible for the brush holding arm 77b to outrun the brush holding arm 77a in the scanning direction so as to be moved to an optional position and, thus, to be held in a predetermined waiting position in an upper portion. It follows that it is possible to control in various fashions the cleaning mode of the wafer W performed by the brushes 76a, 76b.

The scrub cleaning mode using the brush 76a and the brush 76b capable of outrunning the brush 76a will now be described in detail.

Where the scrub cleaning is performed by using one of the brushes 76a, 76b, it is possible to perform the scrub cleaning by using the brush 76a, with the brush 76b, which is positioned remote from the cup 73, being held above the brush bath 67, as described above. Since the brush holding arm 77b positioned remote from the cup 73 is capable of outrunning the brush holding arm 77a, it is possible to perform the scrub cleaning that uses the brush 76b by driving the brush holding arm 77b under the condition that the brush 76a is held above the brush bath 67. It follows that it is possible to perform the scrub cleaning by optionally driving one of the brushes 76a, 76b in the cases where the brushes 76a and 76b differ from each other in the material of those portions which are allowed to abut against the wafer W, where the brushes 76a and 76b differ from each other in construction, and where the brushes 76a, 76b are properly used depending on the object of the cleaning processing, e.g., where the brushes 76a, 76b are used for the rough cleaning and for the finish cleaning, respectively.

Further, it is possible to use the brush 76a alone for the ordinary scrub cleaning and to use the brush 76b as a spare brush in the cases where the brush 76a is made unusable by, for example, the wearing, and where a disorder has taken place in the arm driving mechanism 79a so as to make the brush 76a unusable. It is possible to perform the scrub cleaning in this case, too, by allowing the brush holding arm 77b to outrun the brush holding arm 77a so as to move the brush 76b into the cup 73.

Where it is impossible for the brush holding arm 77b to outrun the brush holding arm 77a, the driving of the brush holding arm 77b is restricted when the brush holding arm 77a is rendered incapable of the driving, resulting in failure to perform the scrub cleaning. However, such a situation can be avoided in the operation mode of this embodiment.

As described above, as the cleaning mode utilizing the construction that the brush 76b is capable of outrunning .the brush 76a, it is possible to perform the scrub cleaning by utilizing any one of the brushes 76a and 76b. In addition, it is also possible to perform the scrub cleaning by utilizing both the brushes 76a and 76b. For example, it is possible to shorten the processing time for a single wafer W by scanning the brushes 76a, 76b in the same direction with the distance between the brushes 76a, 76b set constant, thereby improving the through-put.

In each of the cases where one of the brushes 76a, 76b is used and where both the brushes 76a, 76b are used, it is possible to perform the scrub cleaning under the conditions that the scanning speed of the brush is set constant and that the rotating speed of the wafer W is also set constant. In such a cleaning, the case where one of the brushes 76a, 76b is used differs in the cleaning capability from the case where both the brushes 76a, 76b are used. However, the scrub cleaning equivalent to that in the case of using both the brushes 76a and 76b can be performed in the case of using any one of the brushes 76a and 76b by decreasing the rotating speed of the wafer, and/or decreasing the scanning speed of the brush, and/or increasing the number of scanning operations (the number of reciprocating operations).

An additional cleaning mode of the scrub cleaning unit (SCR) will now be described.

This cleaning mode is desirable in the case of applying a scrub cleaning to the wafer W having a diameter of 300 mm and is directed to the driving mode in which the scrub cleaning is performed by changing the scanning speeds of the brushes 76a, 76b.

It should be noted that the scrub cleaning applied to the wafer W having a diameter of 200 mm is performed in accordance with the recipe that a single brush, e.g., the brush 76a, is used and is allowed to make a reciprocating movement twice over the distance corresponding to the radius of the wafer W, i.e., the distance between the center and the outer circumferential edge of the wafer W, at a scanning speed of 20 mm/second. In this case, it is possible to achieve a sufficient cleaning processing that does not give rise to any problem in terms of the quality of the wafer W after the scrub cleaning treatment, even if the central portion and the peripheral portion of the wafer W differ from each other in the abutting time of the brush 76a against a unit area in an optional position of the wafer W.

However, where the diameter of the wafer W is increased to 300 mm, the abutting time of the brush 76a against a unit area in an optional position of the wafer W is rendered markedly shorter in the peripheral portion of the wafer W, if the brush 76a is scanned at a constant speed as in the wafer having a diameter of 200 mm, resulting in failure to achieve a uniform scrub cleaning over the entire region of the wafer W. It follows that it is difficult to maintain a high cleaning quality of the wafer W.

Under the circumstances, it is desirable to perform a variable scanning operation in which the scanning speed of the brush 76a is changed depending on the position in the radial direction of the wafer W so as to make substantially constant the abutting time of the brush 76a against a unit area in an optional position of the wafer W. The specific mode of the variable scanning of the brush 76a will now be described with reference to FIG. 15.

Figure 15:
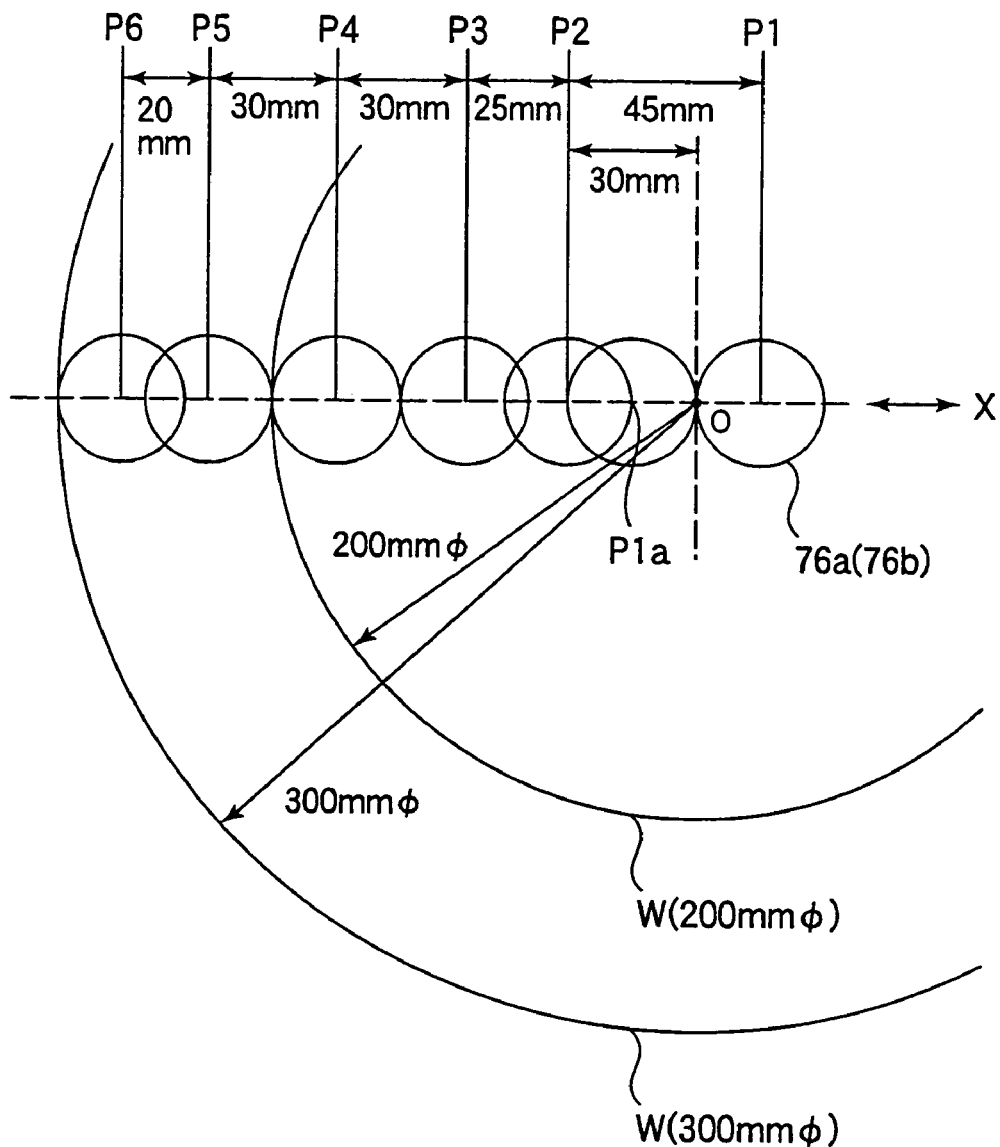
FIG. 15 is a drawing for explaining the conditions set for the brush for variably scanning the brush in the scrub cleaning unit (SCR).

Specifically, FIG. 15 shows the positions of the brush 76a in the radial direction of the wafer W in respect of the wafer W having a diameter of 200 mm and the wafer W having a diameter of 300 mm. In FIG. 15, a mark P1 denotes the central position of the brush 76a when the outer circumferential left edge of the brush 76a abuts against the center O of the wafer W. The brush 76a is moved downward first at the position P1 so as to abut against the wafer W. Likewise, where the brush 76a is scanned to the left in the radial direction (to the left in the X-direction) such that the center of the brush 76a passes through the center O of the wafer W, a mark P4 denotes the central position of the brush 76a when the outer circumferential left edge of the brush 76a is positioned at a diameter of 100 mm from the center of the wafer W, and a mark P6 denotes the central position of the brush 76a when the outer circumferential left edge of the brush 76a is positioned at a diameter of 150 mm from the center of the wafer W. Further, the central positions P2, P3 and P5 of the brush 76a are set such that the central positions P1, P2, P3, P4, P5 and P6 are predetermined distances apart from each other. Specifically, the distance between the central positions P1 and P2 is 45 mm, the distance between the central positions P2 and P3 is 25 mm, the distance between the central positions P3 and P4 is 30 mm, the distance between the central positions P4 and P5 is 30 mm, and the distance between the central positions P5 and P6 is 20 mm, as shown in the drawing.

The scanning speed is 20 mm/sec in the case of the wafer W having a diameter of 200 mm. If the scanning speed of the brush 76a is set in proportion to the contact area of the brush 76a with the wafer W per unit time, with the scanning speed of 20 mm/sec noted above applied to only the scanning between the positions P3 and P4, which corresponds to the scrub cleaning in the peripheral portion of the wafer W having a diameter of 200 mm, the scanning speed of the brush 76a between the adjacent central positions of the brush 76a noted above, hereinafter referred to as the "two reciprocating scanning speed", is as shown in Table 1. As apparent from Table 1, it is necessary to change the scanning speed such that the scanning speed is high in the central portion of the wafer W and that the scanning speed is low in the peripheral portion of the wafer W.

TABLE 1

| Brush Position | Two reciprocating scanning speed (mm/sec) | One reciprocating scanning speed (mm/sec) | One way scanning time (seconds) in one reciprocating scanning speed |
|---|---|---|---|
| Between positions P1-P2 | 56 | 28 | 1.6 |
| Between positions P2-P3 | 21 | 10.5 | 2.4 |
| Between positions P3-P4 | 20 | 10 | 3 |
| Between positions P4-P5 | 15 | 7.5 | 4 |
| Between positions P5-P6 | 12 | 6 | 6.7 |
| Total | | | 13.7 |

It was customary in the past to allow the brush 76a to make a reciprocating movement twice between the positions P1 and P4 in the wafer having a diameter of 200 mm. Therefore, in the case of employing the "two reciprocating scanning speed" shown in Table 1, it is necessary to allow the brush 76a to make a reciprocating movement twice even in the case of employing the variable scanning. It follows that it is possible to allow the brush 76a to make a reciprocating movement twice between the positions P1 and P6 in the case of the wafer W having a diameter of 300 mm. However, in order to facilitate the control of the brush 76a, the brush 76a is allowed to make a reciprocating movement only once between the points P1 and P6 by decreasing the scanning speed to a half in place of allowing the brush 76a to make a reciprocating movement twice between the positions P1 and P6. The scanning speed in this case is called herein later "one reciprocating scanning speed".

As shown in Table 1, the one reciprocating scanning speed is half the two reciprocating scanning speeds. The one way scanning time shown in Table 1 can be obtained, if the one way scanning time in the case of scanning the brush 76a between the positions P1 and P6 at the one reciprocating scanning speed is calculated from the one reciprocating scanning speed and the moving distance of the brush 76a between the adjacent central positions shown in FIG. 15. As apparent from Table 1, the reciprocating scanning time of the brush 76a for a single wafer W having a diameter of 300 mm is 27.4 seconds, which is two times as long as the one way scanning time of 13.7 seconds.

Where the brush 76a is reciprocated twice between the positions P1 and P6, which corresponds to the radius of the wafer W having a diameter of 300 mm, at a constant speed of 20 mm/sec, which is the scanning condition of the wafer W having a diameter of 200 mm, the reciprocating time for a single wafer W having a diameter of 300 mm is 30 seconds. The reciprocating time of 30 seconds noted above is longer than that in the case of employing the variable scanning described above. In addition, the difference in the uniformity of the scrub cleaning between the central portion and the peripheral portion of the wafer W is rendered greater than that in the case of employing the variable scanning. It follows that the quality of the wafer W is considered to be rendered poor.

In other words, where the scrub cleaning is carried out by the variable scanning method by using any one of the brushes 76a and 76b as described above, the cleaning time can be shortened, compared with the case of employing the conventional cleaning method in which the scanning is performed at a constant speed. In addition, the cleaning processing can be applied uniformly over the entire region of the wafer W so as to maintain a high quality of the wafer W.

The variable scanning can also be employed in the case of using both the brushes 76a and 76b simultaneously. For example, the brushes 76a, 76b are moved first to the position P1, and the scanning from the position P1 to the position P2 is started by using the brush 76a. Then, a predetermined time later, e.g., 2 seconds later, the brush 76b is allowed to abut against the wafer W at the position P1 and the scanning toward the position P6 is started. In this case, the brush 76a moving from the position P6 back to the position P1 collides against the trailing brush 76b moving from the position P1 toward the position P6. Therefore, the brush 76b is once held in a predetermined position, e.g., above the position P5, before the collision, and the brush 76b is allowed to abut again against the wafer W so as to start again the scanning operation after the brush 76a has passed through the region below the brush 76b.

After completion of a single scanning operation, the brush 76a is brought back to the home position, and brush 76b is moved upward when the brush 76b has been brought back to the position P1 and, then, brought back to the home position. It follows that the cleaning processing can be finished while avoiding the collision between the brushes 76a and 76b.

As described above, where a single reciprocating scanning is performed by using the two brushes 76a and 76b with the scanning speed of each of these brushes 76a and 76b set at the one reciprocating scanning speed shown in Table 1, the cleaning processing substantially equal to that in the case of allowing a single brush 76a to make a reciprocating movement twice at the one reciprocating scanning speed can be performed in a treating time equal to the sum of 27.4 seconds, which is the reciprocating scanning time using the one reciprocating scanning speed, and a slight waiting time of the brush 76b at the position P5. In other words, it is possible to carry out a more precise cleaning processing so as to obtain the effect of improve the quality of the cleaned surface of the wafer W, though the treating time for a single wafer W is prolonged only slightly.

On the other hand, where one reciprocating scanning is performed by using the two brushes 76a, 76b at the two reciprocating scanning speed shown in Table 1, the reciprocating scanning time can be shortened to a time equal to the sum of 13.7 seconds and a slight waiting time of the brush 76b. In addition, it is possible to carry out the cleaning processing substantially equal to that in the case of performing the one reciprocating scanning by using a single brush 76a at the one reciprocating scanning speed. In other words, it is possible to increase the through-put while maintaining the quality of the cleaned surface of the wafer W by increasing the scanning speed by using the two brushes 76a and 76b.

Incidentally, in the case of using the two brushes 76a and 76b simultaneously, it is possible to shorten the treating time so as to improve the through-put or to improve the quality of the cleaning processing by allowing the brush 76a to be scanned between the positions P1 and P6 and by allowing the other brush 76b to be scanned to the right in the X-direction in FIG. 15 from a position P1a shown in FIG. 15, which is in symmetry with the position P1 with respect to the center O of the wafer W, after the brush 76a has passed through the position P1a. In this case, if the brush 76a is held in, for example, the position P2 after the brush 76a has been brought back to the position P1, it is possible to prevent the collision between the brushes 76a and 76b.

It should also be noted that, in the case of using the two brushes 76a and 76b as described above in the variable scanning, it is possible to use the two brushes 76a and 76b simultaneously for the different purposes of the cleaning processing. For example, it is possible to perform the scrub cleaning by using the two brushes simultaneously such that one brush 76a is used for the rough cleaning and the other brush 76b is used for the finish cleaning. The situations of making the two brushes 76a, 76b different from each other in the cleaning object include, for example, the cases where those portions of the brushes 76a, 76b which are allowed to abut against the wafer W are formed of the materials adapted for the purposes, and where the kinds of the cleaning liquids supplied from the cleaning liquid supply mechanisms mounted to the brush holding arms 77a, 77b, as required, are changed. By employing these constructions, it is possible to perform the cleaning processing more effectively.

In order to perform the finish cleaning after the rough cleaning, it is desirable to scan the brushes 76a, 76b such that the brush 76b for the finish cleaning is moved behind the brush 76a for the rough cleaning in a manner to follow the brush 76a. For realizing the particular situation, the brushes 76a, 76b can be controlled easily, if the scanning is performed such that, for example, these brushes 76a, 76b are moved from an outer circumferential edge of the wafer W toward the outer circumferential edge on the opposite side of the wafer W through the center O of the wafer W.

To be more specific, if the scanning of the brush 76a is started first from an outer circumferential edge of the wafer W, with the brush 76a allowed to abut against the wafer W, followed by scanning the brush 76b a predetermined time later in a manner to follow the locus of the scanning of the brush 76a, the wafer W is in the state of having received the cleaning processing by the brush 76b at the time when the scanning of the brushes 76a and 76b has been finished, i.e., in the state of having received the finish cleaning. Also, it is possible to avoid the collision between the brushes 76a and 76b. Further, it is also possible to perform easily the reciprocating scanning, if the brush 76b is held in an upper waiting position after the brush 76b has reached one outer circumferential edge of the wafer W.

In the embodiment described above, the predetermined positions P1 to P6 are provided in the radial direction of the wafer W, and the scanning speed of the brushes 76a, 76 is changed stepwise for each region between the adjacent positions selected from the positions P1 to P6 for performing the variable scanning of the brushes 76a and 76b. However, it is possible to change continuously the scanning speed of the brushes 76a, 76b such that the scanning speed is high in the central portion and low in the peripheral region of the wafer W.

In the embodiment described above, one or both of the brushes 76a and 76b are used for the cleaning operation and the scanning speed of the brush was changed depending on the position in the radial direction of the wafer W. Alternatively, it is also possible to change the rotating speed of the wafer W in accordance with the positions of the brushes 76a, 76b, with the scanning speeds of the brushes 76a, 76b set constant, so as to obtain the same effects, i.e., the effects of increasing the through-put and of improving the quality of the cleaned surface of the wafer W.

In this case, if one of the brushes 76a, 76b is used, the rotating speed of the wafer W is controlled depending on the position of the brush used, quite naturally. On the other hand, in the case of using the brushes 76a and 76b simultaneously, it suffices to control the rotating speed of the wafer W with the position of one of the brushes 76a and 76b used as the criterion. In the case of using the two brushes 76a and 76b simultaneously, the driving of the nozzle holding arms 77a, 77b is controlled so as not to bring about the collision between the brushes 76a and 76b, quite naturally. It is also possible to employ the cleaning processing method in which the variable scanning is performed by using one or both of the brushes 76a and 76b, and the rotating speed of the wafer W is changed in accordance with the position of one of the brushes 76a and 76b.

As described above, various cleaning methods can be selected in the scrub cleaning unit (SCR). The cleaning method can be selected as desired by allowing the operator to operate a button arranged in an operation panel for selecting a desired cleaning processing method so as to input the required driving parameter. In this case, where the two brushes 76a, 76b are used simultaneously, it is desirable to arrange the system such that, if the driving parameters for one of the brushes and one of the brush holding arms, which are driven first, are inputted, a predetermined control parameter is automatically imparted to the driving parameters for the succeeding brush and the succeeding brush holding arm so as to prevent the succeeding brush and the brush holding arm from colliding against the preceding brush. In the case of using a control device capable of avoiding the collision of the brush and the brush holding arm, it is possible to avoid the collision between the preceding brush and the succeeding brush even if, for example, there is an erroneous input in respect of the driving parameters of the succeeding brush. It is also possible to construct the apparatus such that some processing programs are stored in advance in the cleaning processing system 1 and the scrub cleaning is automatically started by selecting the processing program.

Incidentally, the various cleaning modes described above, which use the brushes 76a, 76b, can be realized by allowing the controller 80 to control the brush arms 77a, 77b.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, it is possible for 4 or more carriers C to be arranged on the table 11. By contraries, it is possible for two carriers C or only one carrier C to be arranged on the table 11. Also, only one wafer transfer mechanism 13 is used in the embodiment described above. However, it is possible to use a plurality of wafer transfer mechanisms.

In the embodiment described above, a brush having a rotary mechanism is allowed to abut against the wafer W in the scrub cleaning unit (SCR). However, it is also possible to use a brush that does not have a rotary mechanism. Also, the number of rise nozzles and the number of brushes are not limited to those in the embodiment described above. Also, in the scrub cleaning unit (SCR) included in the embodiment described above, the sink 68 is partitioned into the cleaning processing chamber 82a and the driving mechanism arranging chamber 82b by using the partition wall 98. Alternatively, it is also possible couple a sink housing the cleaning processing chamber 82a with a sink housing the driving mechanism arranging chamber 82b in a manner to have the window portion 98 and the opening formed therein.

The embodiment described above is directed to the scrub cleaning of a semiconductor wafer. However, the technical idea of the present invention can also be applied to the scrub cleaning of other substrates such as a LCD substrate. Further, the method of spurting a predetermined cleaning liquid from the rinse nozzles 86a, 86b onto a predetermined position of the wafer W and the construction that the cleaning processing chamber 82a and the driving mechanism arranging chamber 82b are partitioned by using the partition wall 98 and the window portion 98a can also be employed for the other processing of a semiconductor wafer or an LCD substrate, e.g., can be employed for the rinsing treatment in the developing processing.

What is claimed is:

1. A cleaning processing system for applying a series of processing for the cleaning processing to a substrate, comprising:
    a plurality of scrub cleaning units stacked one upon the other to form a multi-stage system; and
    a substrate transfer mechanism capable of gaining access to all of said plural scrub cleaning units
    wherein a scrub cleaning unit includes:
    a spin chuck for holding a substrate substantially horizontal thereby to allow the substrate to make a planar rotation;
    a plurality of brushes abutting against the upper surface of the substrate held by said spin chuck thereby to perform a scrub cleaning;
    a plurality of brush holding arms holding said plural brushes, respectively; and
    an arm driving mechanism for independently driving straight each of said plural brush holding arms.

2. A cleaning processing system for applying a series of processing for the cleaning processing to a substrate, comprising:
    a plurality of scrub cleaning units stacked one upon the other to form a multi-stage system; and
    a substrate transfer mechanism capable of gaining access to all of said plural scrub cleaning units
    wherein a scrub cleaning unit includes:
    a spin chuck for holding a substrate substantially horizontal thereby to allow the substrate to make a planar rotation;
    a cup arranged to surround the substrate and said spin chuck;
    a process liquid supply mechanism for supplying a predetermined process liquid to a predetermined position of the substrate held by said spin chuck;
    a brush abutting against the upper surface of the substrate held by said spin chuck thereby to perform a scrub cleaning;
    a brush holding arm for holding said brush; and
    an arm driving mechanism for driving said brush holding arm;
    wherein said cup includes a cylindrical body and upper and lower stage tapered portions inclined from the inner wall of said cylindrical body toward an inner and upper region of said cup thereby to suppress the diffusion of the cleaning liquid supplied to the substrate held by said spin chuck to the outside of said cup.

3. A cleaning processing system for applying a series of processing for the cleaning processing to a substrate, comprising:
    a plurality of scrub cleaning units stacked one upon the other to form a multi-stage system; and
    a substrate transfer mechanism capable of gaining access to all of said plural scrub cleaning units
    wherein a scrub cleaning unit includes:
    a spin chuck for holding a substrate substantially horizontal thereby to allow the substrate to make a planar rotation;
    a plurality of brushes for cleaning the upper surface of the substrate held by said spin chuck;
    a plurality of brush holding arms holding said plural brushes, respectively, and;
    a plurality of arm driving mechanisms for independently scanning said plural brush holding arms.

4. A cleaning processing system for applying a series of processing for the cleaning processing to a substrate, comprising:
    a cleaning processing section including a plurality of process units for applying predetermined processing to the substrate; and
    a substrate loading/unloading section for loading and unloading the substrate into and out of said cleaning processing section;
    wherein said cleaning processing section includes:
    a plurality of scrub cleaning units arranged to form at least upper and lower stages;
    a substrate inverting unit for turning the substrate upside down;
    a substrate transit unit for temporarily disposing the substrate thereon for the transfer of the substrate to and from said substrate loading/unloading section; and
    a substrate transfer mechanism capable of gaining access to all of the process units including said scrub cleaning unit, said substrate inverting unit, and said substrate transit unit thereby to perform transfer of the substrate among said process units.

5. The cleaning processing system according to claim 4, comprising a plurality of said substrate transit units, at least two substrate transit units being stacked one upon the other.

6. The cleaning processing system according to claim 4, comprising a plurality of said substrate inversion units, at least two substrate inversion units being stacked one upon the other.

7. The cleaning processing system according to claim 4, comprising a plurality of said substrate transit units and a plurality of said substrate inversion units, at least two substrate transit units being stacked one upon the other and at least two substrate inversion mechanisms being stacked on the uppermost stage of said substrate transit unit.

8. The cleaning processing system according to claim 4, wherein said substrate inversion unit includes:
    a substrate relay section for performing the substrate transfer to and from said substrate transfer mechanism;
    a lift mechanism for vertically moving said substrate relay section; and
    a substrate inversion mechanism for holding and receiving the substrate held by said substrate relay section, inverting the held substrate by rotation, and transferring the substrate onto said substrate relay section.

9. The cleaning processing system according to claim 4, further comprising a filter fan unit arranged in an upper portion of said cleaning processing section for guiding downward a clean air into said cleaning processing section.

10. The cleaning processing system according to claim 9, wherein said substrate transfer mechanism comprises a transfer member movable within a moving space extending in a vertical direction.

11. The cleaning processing system according to claim 10, wherein said substrate transit unit and said substrate inversion unit are arranged in contact with said substrate loading/unloading section, and said clean air flowing downward flows from the moving space of said transfer member into said substrate loading/unloading section through said substrate transit unit.

12. The cleaning processing system according to claim 4, wherein two scrub cleaning units are stacked one upon the other to form upper and lower stage scrub cleaning units.

13. The cleaning processing system according to claim 12, wherein said scrub cleaning unit arranged to form the upper stage is used for cleaning the front surface of the substrate, and the scrub cleaning unit arranged to form the lower stage is used for cleaning the back surface of the substrate.

14. The cleaning processing system according to claim 13, wherein a vacuum suction mechanism is used in the chuck for holding the substrate in the scrub cleaning unit for cleaning the front surface of the substrate, and a mechanical holding mechanism is used in the chuck for holding the substrate in the scrub cleaning unit for cleaning the back surface of the substrate.

15. The cleaning processing system according to claim 12, further comprising a filter fan unit arranged in an upper portion of said cleaning processing section for guiding downward a clean air into said cleaning processing section, the clean air being guided directly from said filter fan unit into said upper stage scrub cleaning unit.

16. The cleaning processing system according to claim 15, further comprising a pipe joining said upper stage scrub cleaning unit and said lower stage scrub cleaning unit, the clean air supplied from said filter fan unit into said upper stage scrub cleaning unit being guided into said lower stage scrub cleaning unit through said pipe.

17. The cleaning processing system according to claim 15, further comprising a sub-filter fan unit arranged in an upper portion of said lower stage scrub cleaning unit and a pipe joining said filter fan unit and said sub-filter fan unit, the clean air being guided from said filter fan unit into said lower stage scrub cleaning unit through said pipe and said sub-filter fan unit.

18. The cleaning processing system according to claim 4, wherein said cleaning processing section includes a plurality of thermal processing units for applying a heating or cooling treatment to a substrate.

19. The cleaning processing system according to claim 18, wherein said plural thermal processing units are stacked one upon the other in the vertical direction.

* * * * *